US007332780B2

(12) United States Patent
Matsuda et al.

(10) Patent No.: US 7,332,780 B2
(45) Date of Patent: Feb. 19, 2008

(54) INVERTER, SEMICONDUCTOR LOGIC CIRCUIT, STATIC RANDOM ACCESS MEMORY AND DATA LATCH CIRCUIT

(75) Inventors: Sumio Matsuda, Tsukuba (JP); Satoshi Kuboyama, Tsukuba (JP); Yasushi Deguchi, Tsukuba (JP)

(73) Assignee: Japan Aerospace Exploration Agency, Tokyo (JP)

( * ) Notice: Subject to any disclaimer, the term of this patent is extended or adjusted under 35 U.S.C. 154(b) by 660 days.

(21) Appl. No.: 10/377,884

(22) Filed: Mar. 4, 2003

(65) Prior Publication Data

US 2004/0007743 A1 Jan. 15, 2004

(30) Foreign Application Priority Data

Jul. 9, 2002 (JP) ............................. 2002-200130

(51) Int. Cl.
*H01L 29/76* (2006.01)
(52) U.S. Cl. .................. 257/369; 257/903; 257/204; 257/206; 257/E21.661; 257/E27.099; 365/205; 365/206; 365/207
(58) Field of Classification Search ................ 257/367, 257/368, 369, 370, 366, 365, 903, 205, 206; 365/95; 327/277, 208, 210
See application file for complete search history.

(56) References Cited

U.S. PATENT DOCUMENTS

| 4,956,815 | A | * | 9/1990 | Houston | 365/154 |
| 5,018,102 | A | * | 5/1991 | Houston | 365/95 |
| 5,111,429 | A | | 5/1992 | Whitaker | |
| 5,307,142 | A | | 4/1994 | Corbett et al. | |
| 5,457,420 | A | | 10/1995 | Asada | |
| 6,278,287 | B1 | * | 8/2001 | Baze | 326/9 |
| 6,369,630 | B1 | * | 4/2002 | Rockett | 327/210 |
| 6,377,097 | B1 | * | 4/2002 | Shuler, Jr. | 327/208 |
| 6,487,134 | B2 | * | 11/2002 | Thoma et al. | 365/205 |
| 6,573,773 | B2 | * | 6/2003 | Maki et al. | 327/200 |
| 2001/0028268 | A1 | * | 10/2001 | Shuler, Jr. | 327/277 |
| 2001/0028269 | A1 | * | 10/2001 | Shuler, Jr. | 327/277 |

(Continued)

FOREIGN PATENT DOCUMENTS

JP 60 158723 8/1985

(Continued)

OTHER PUBLICATIONS

Patent Abstracts of Japan vol. 9, No. 325 (E-368) (Dec. 20, 1985).

(Continued)

*Primary Examiner*—Sue A. Purvis
*Assistant Examiner*—Fazli Erdem
(74) *Attorney, Agent, or Firm*—Jacobson Holman PLLC

(57) ABSTRACT

A dual structure is introduced to the transistor in a flip-flop or a data input step controlled by a clock of a semiconductor logic circuit. The dual structure is formed by connecting a transistor with a MOS transistor having a channel of the same conductivity type in series with respect to the line of a source or drain and connecting their gates to each other, or by connecting an inverter with p-MOS transistors, one for VDD side and one for VSS side of the output step. The dual structure prevents single event phenomenon in a semiconductor logic circuit, such as inverter, SRAM and data latch circuit.

23 Claims, 20 Drawing Sheets

U.S. PATENT DOCUMENTS

2001/0054926 A1* 12/2001 Minami et al. .............. 327/277
2002/0018372 A1    2/2002 Thoma et al.
2002/0063583 A1    5/2002 Eaton
2003/0117221 A1*   6/2003 Knowles et al. .............. 331/57

FOREIGN PATENT DOCUMENTS

| JP | 64-24629 | * | 1/1989 |
| JP | 06 318858 | | 11/1994 |
| JP | 08 213883 | | 8/1996 |

OTHER PUBLICATIONS

Patent Abstracts of Japan vol. 1995, No. 2 (Mar. 31, 1995).
Patent Abstracts of Japan vol. 1996, No. 12 (Dec. 26, 1996).

* cited by examiner

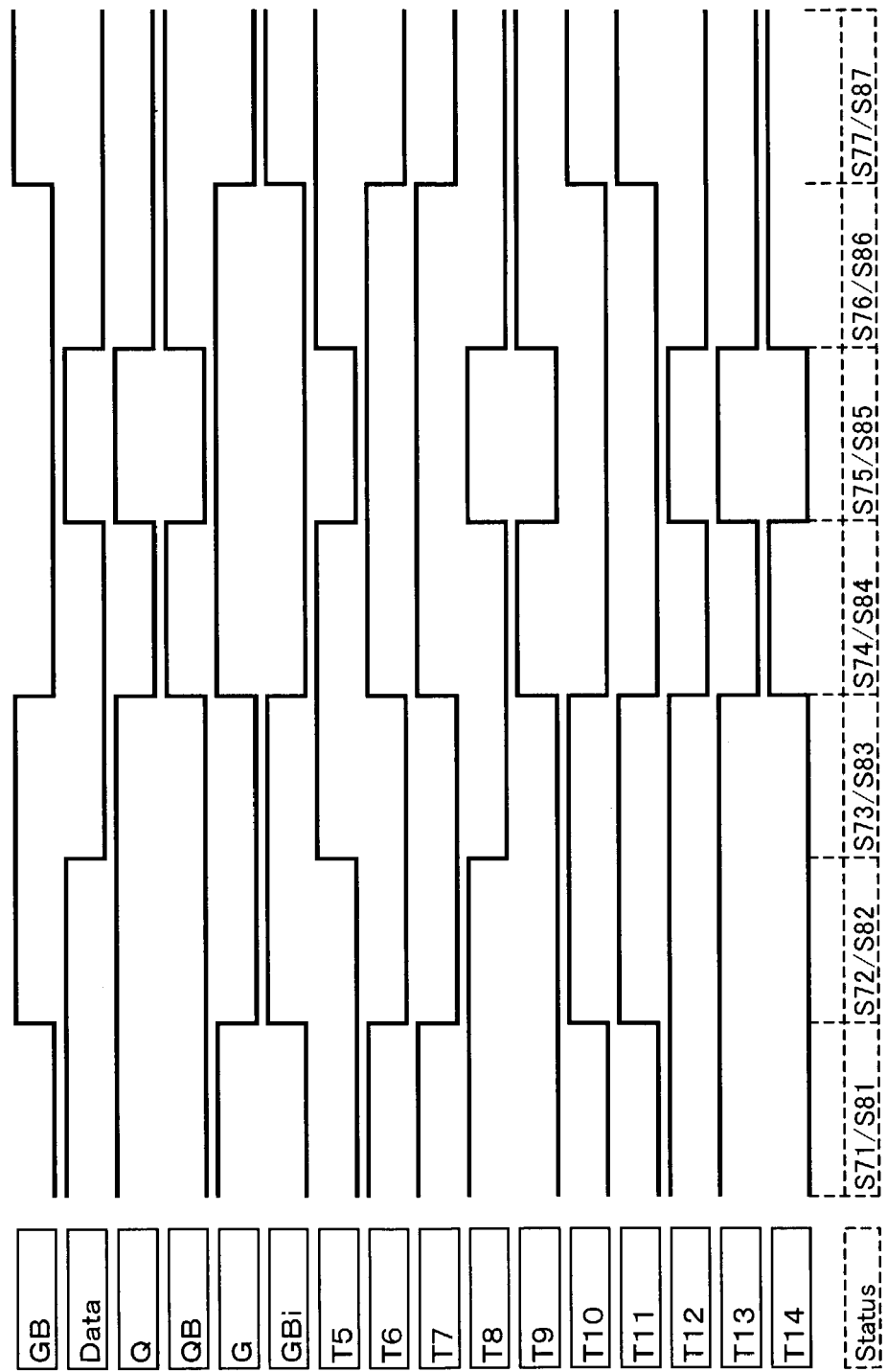

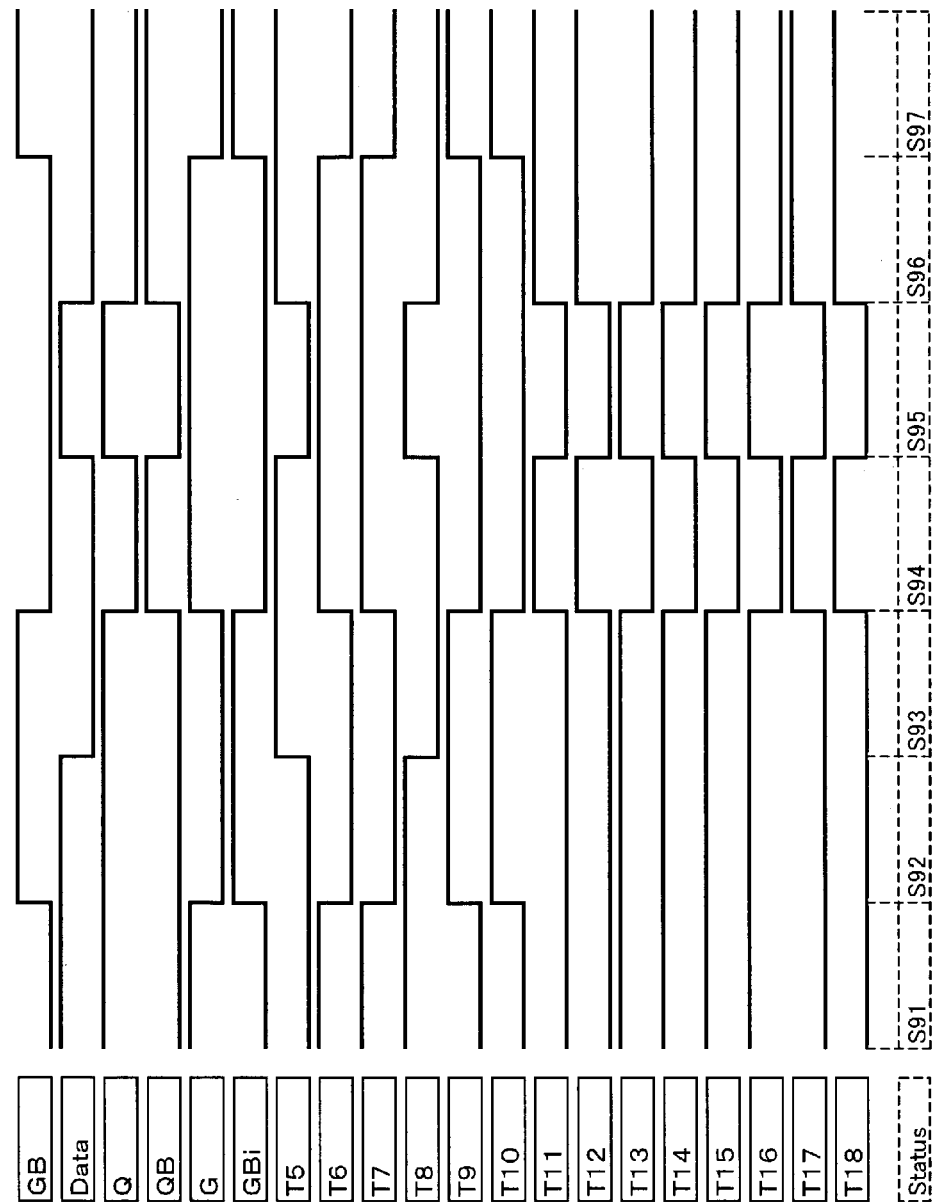

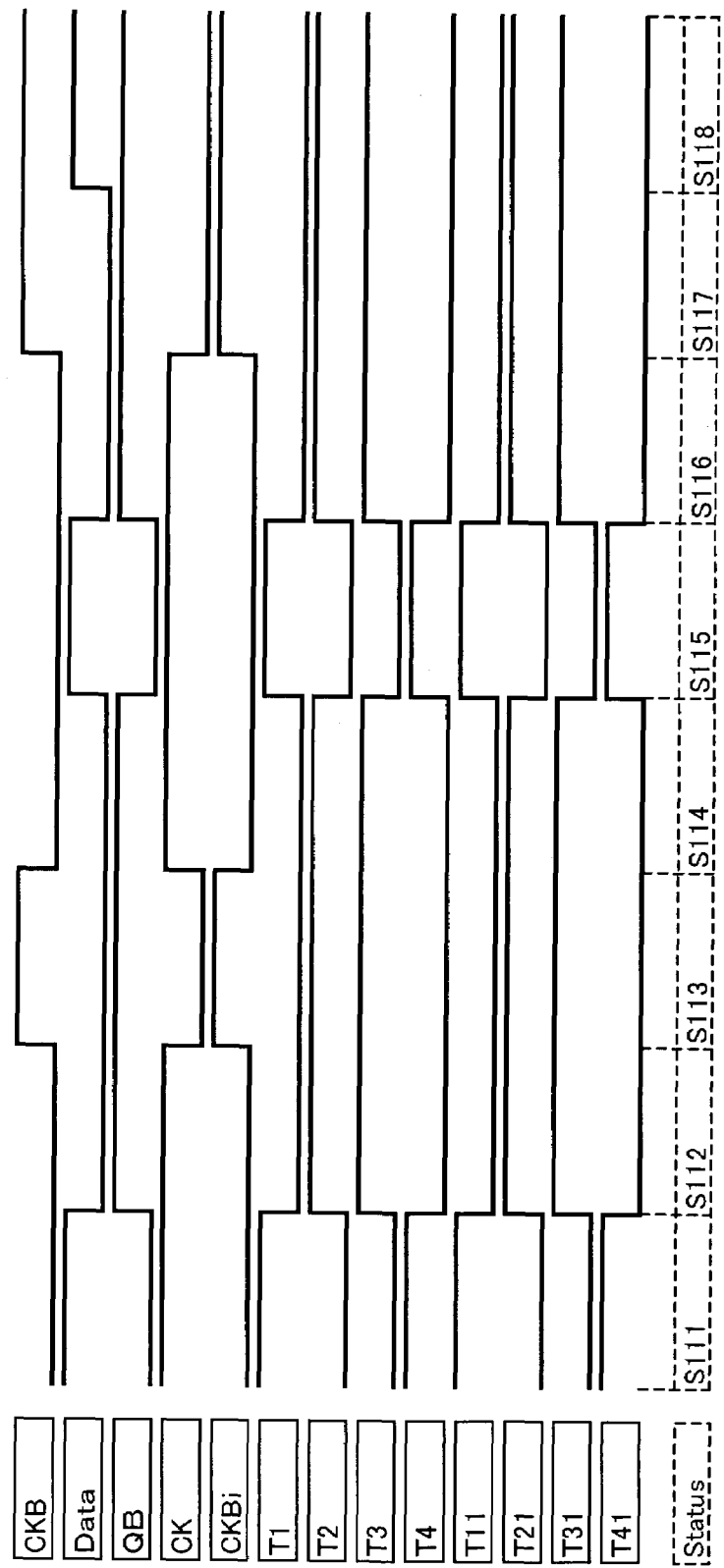

INVERTER, SEMICONDUCTOR LOGIC CIRCUIT, STATIC RANDOM ACCESS MEMORY AND DATA LATCH CIRCUIT

BACKGROUND OF THE INVENTION

1. Field of the Invention

The present invention relates to a semiconductor logic circuit comprising inverter, static random access memory (hereinafter called "SRAM") and data latch circuit, and more particularly to a semiconductor logic circuit containing MOS transistor or memory element having a dual structure for preventing the malfunction due to a single event.

2. Description of Prior Art

A prior art semiconductor logic circuit, which comprises two inverters cross-connected to each other by connecting the output of one to the input of the other, has a structure comprising a flip-flop for retaining the data of 1 or 0 corresponding to a voltage level and a control element for executing the actions such as the proper writing and reading of data. In addition, a semiconductor logic circuit comprising a CMOS switch or a clocked inverter, which outputs the signal corresponding to the input data signal to a downstream under the control of the clock signal, can capture the input data signal to its inside under the control of the clock signal. With such a structure, SRAM can execute the writing, storing and reading of data, and a data latch circuit can capture data by the input of the clock signal and retain the data until the input of the next clock signal.

However, when the prior art semiconductor logic circuit in operation is irradiated by a high energy particle beam such as a radiation ray or an ion beam, electron-hole pairs are grown in the elements of the semiconductor logic circuit, and electric charge is generated. When the generated electric charge flows into the elements in the semiconductor logic circuit, it induces malfunction of them, such that the data stored in SRAM or latched in a data latch circuit is inverted, or a data is captured with no clock signal for action supplied in the data latch circuit. Such phenomenon is called "single event (single event upset)." This single event is often observed in the environment where the high energy particles tend to exist, such as high altitude air, aerospace and the facilities related to radioactive rays, and causes retardation in the regular performance of the computers under such environment. It is not practical to intercept such high energy particles completely in order to prevent the single event. Therefore, in order to prevent the single event effectively, it is necessary to achieve a semiconductor logic circuit having a structure which can prevent the single event by itself.

SUMMARY OF THE INVENTION

Accordingly, it is an object of the present invention to solve the aforementioned problems in the prior art, and to prevent the single event by employing a dual structure in the MOS transistor or the flip-flop, and thus even if malfunction occurs in one of the MOS transistors, to block the adverse effect therefrom. The above-described object is achieved by the present invention having the following features. Namely, the invention in a first embodiment is an inverter having a structure that a first p-channel MOS transistor and a first n-channel MOS transistor are connected in this order in series with respect to the line of a source or drain and from the node connected to the side of the first power supply to the node connected to the side of the second power supply, wherein at least one of said first p-channel MOS transistor and said first n-channel MOS transistor constitutes a dual structure by being connected with a second MOS transistor having a channel of the same conductivity type in series with respect to the line of a source or drain, and their gates being connected to each other.

The invention in a second embodiment is an inverter having a structure that a first p-channel MOS transistor and a first n-channel MOS transistor are connected in this order in series with respect to the line of a source or drain and from the node connected on the side of the first power supply to the node connected on the side of the second power supply, wherein said first p-channel MOS transistor constitutes a dual structure by being connected with a second p-channel MOS transistor in series with respect to the line of a source or drain at the node on the side of the second power supply, and their gates being connected to each other, and said first n-channel MOS transistor constitutes a dual structure by being connected with a third p-channel MOS transistor in series with respect to the line of a source or drain at the node on the side of the first power supply, and the gate of the third p-channel MOS transistor being connected in common to the node of said n-channel MOS transistor on the side of the first power supply and the node of said first p-channel MOS transistor on the side of the second power supply.

The invention in the second embodiment also is an inverter in which a first p-channel MOS transistor, a second p-channel MOS transistor, a third p-channel MOS transistor and an n-channel MOS transistor, each of which constitutes an inverter, are connected in this order in series with respect to the line of a source or drain and from the node connected on the side of a first power supply to the node connected on the side of a second power supply, wherein the gates of said first p-channel MOS transistor, said second p-channel MOS transistor and said n-channel MOS transistor are connected in common and are connected to the input of said inverter, the gate of said third p-channel MOS transistor is connected to the node between said third p-channel MOS transistor and said n-channel MOS transistor with respect to the line of a source or drain, and in common to the node between said first p-channel MOS transistor and said second p-channel transistor with respect to the line of a source or drain, the node between said second p-channel MOS transistor and said third p-channel MOS transistor on the line of a source or drain is connected to the output of said inverter, said first p-channel MOS transistor and said second p-channel MOS transistor form a p-channel MOS transistor having a dual structure, and said third p-channel MOS transistor and said n-channel MOS transistor form an n-channel MOS transistor having a dual structure.

The invention in a third embodiment is characterized by, in addition to the features of the invention of any one of the first and second embodiments, that the domain of the source and drain of two MOS transistors contained in the MOS transistor having said dual structure are positioned along a single line.

The invention in a fourth embodiment is characterized by, in addition to the features of the invention of any one of the first to third embodiments, that two MOS transistors contained in the MOS transistor having said dual structure are positioned by spacing a predetermined space between the gates of each other.

The invention in a fifth embodiment is characterized by, in addition to the features of the fourth embodiment, that said predetermined space between the gates is between 2 μm and 8 μm.

The invention in a sixth embodiment is characterized by, in addition to the features of the fourth embodiment, that said predetermined space between the gates is between 2 µm and 5 µm.

The invention in a seventh embodiment is a semiconductor logic circuit comprising two inverters cross-connected to each other by connecting the output of one to the input of the other, wherein at least one inverter of said inverters is the inverter of any of the first to sixth embodiments.

The invention in an eighth embodiment is a static random access memory comprising two inverters cross-connected to each other by connecting the output of one to the input of the other, wherein at least one inverter of said inverters is the inverter of any of the first to sixth embodiments.

The invention of a ninth embodiment is a data latch circuit comprising two inverters cross-connected to each other by connecting the output of one to the input of the other where the output of one of said inverters is connected to the input of the other of said inverters under the control of the inverted logic signal of the clock signal for control, wherein at least one inverter of said inverters is the inverter of any of the first to sixth embodiments.

The invention of a tenth embodiment is a semiconductor logic circuit comprising a CMOS switch in which a data signal is connected to one terminal and said data signal is output from the other terminal to a downstream under the control of the clock signal for control, wherein at least one MOS transistor of the p-channel MOS transistor and the n-channel MOS transistor contained in said CMOS switch whose gate is connected to said clock signal for control constitutes a dual structure by being connected with a MOS transistor having a channel of the same conductivity type in series with respect to the line of a source or drain, and their gates being connected to each other.

The invention of an eleventh embodiment is characterized by, in addition to the features of the tenth embodiment, that two MOS transistors contained in the MOS transistor having said dual structure are connected, via the line of a source or drain of MOS transistor whose gate is connected to said data signal, in series with respect to the line of a source or drain.

The invention in a twelfth embodiment is characterized by, in addition to the features of the tenth embodiment, that said semiconductor logic circuit is a data latch circuit which further comprises the second inverter whose input is connected to said signal output to a downstream, and the third inverter, which is controlled by complementary clock signals of logic functionally contrary to said clock signal for control, whose input is connected to the output of said second inverter, and whose output is connected to the input of said second inverter.

The invention in a thirteenth embodiment is characterized by, in addition to the features of the tenth embodiment, that the domain of the source and drain of two MOS transistors contained in the MOS transistor having said dual structure are positioned along a single line.

The invention of a fourteenth embodiment is characterized by, in addition to the features of the tenth embodiment, that two MOS transistors contained in the MOS transistor having said dual structure are positioned by spacing a predetermined space between the gates of each other.

The invention set out in a fifteenth embodiment is characterized by, in addition to the features of the fourteenth embodiment, that said predetermined space between the gates is between 2 µm and 8 µm.

The invention of a sixteenth embodiment is characterized by, in addition to the features of the fourteenth embodiment, that said predetermined space between the gates is between 2 µm and 5 µm.

The invention in a seventeenth embodiment is a semiconductor logic circuit comprising a first inverter in which a data signal is connected to the input and an inverted logic signal of said data signal is output to a downstream under the control of the complementary clock signals for control, wherein at least one MOS transistor of the p-channel MOS transistor and the n-channel MOS transistor contained in said first inverter whose gate is connected to said complementary clock signal for control constitutes a dual structure by being connected with a MOS transistor having a channel of the same conductivity type in series with respect to the line of a source or drain, and their gates being connected to each other.

The invention of a eighteenth embodiment is characterized by, in addition to the features of the seventeenth embodiment, that two MOS transistors contained in the MOS transistor having said dual structure are connected, via the line of a source or drain of MOS transistor whose gate is connected to said data signal, in series with respect to the line of a source or drain.

The invention in a nineteenth embodiment is characterized by, in addition to the features of the seventeenth embodiment, that said semiconductor logic circuit is a data latch circuit which further comprises the second inverter whose input is connected to said signal output to a downstream, and the third inverter, which is controlled by a complementary clock signal of logic contrary to said complementary clock signal for control, whose input is connected to the output of said second inverter, and whose output is connected to the input of said second inverter.

The invention of a twentieth embodiment is characterized by, in addition to the features of the seventeenth embodiment, that the domain of the source and drain of two MOS transistors contained in the MOS transistor having said dual structure are positioned along a single line.

The invention of a twenty-first embodiment is characterized by, in addition to the features of the seventeenth embodiment, that two MOS transistors contained in the MOS transistor having said dual structure are positioned by spacing a predetermined space between the gate of each other.

The invention of a twenty-second embodiment is characterized by, in addition to the features of the twenty-first embodiment, that said predetermined space between the gates is between 2 µm and 8 µm.

The invention of a twenty-third embodiment is characterized by, in addition to the features of the twenty-first embodiment, that said predetermined space between the gates is between 2 µm and 5 µm.

The invention of a twenty-fourth embodiment is a data latch circuit comprising a first data latch circuit which comprises a first inverter (11I1), a second inverter (11I2), a first CMOS switch (11S1) in which a data signal is connected to one terminal and said data signal is output from the other terminal to a downstream under the control of the clock signal for control, and a second CMOS switch (11S2) in which the output of said second inverter is connected to one terminal and the data signal input from said one terminal is output from the other terminal to a downstream under the control of the inverted logic signal of said clock signal; and a second data latch circuit which comprises a third inverter (11I3), a fourth inverter (11I4), a third CMOS switch (11S3) in which said data signal is connected to one terminal and said data signal is output from the other terminal to a downstream under the control of said clock signal for control, and a fourth CMOS switch (11S4) in which the output of said fourth inverter is connected to one terminal and the data signal input from said one terminal is output from the other terminal to a downstream under the control of the inverted logic signal of said clock signal, wherein each of said first, second, third and fourth inverters comprises a p-channel MOS transistor and an n-channel MOS transistor connected in series with respect to the line of a source or drain, the output of said first inverter is connected to the gate of the transistor having one conductivity type of said second inverter and to the gate of the transistor having said one conductivity type of said fourth inverter, the output of said third inverter is connected to the gate of the transistor having the other conductivity type of said second inverter and to the gate of the transistor having said other conductivity type of said fourth inverter, the output of said second inverter is connected, via said second CMOS switch, to the gate of the transistor having one conductivity type of said first inverter and to the gate of the transistor having said one conductivity type of said third inverter, the output of said fourth inverter is connected, via said fourth CMOS switch, to the gate of the transistor having the other conductivity type of said first inverter and to the gate of the transistor having said other conductivity type of said third inverter, the output from said other terminal of said first CMOS switch is connected to the output from said other terminal of said second CMOS switch, to the gate of the transistor having said one conductivity type of said first inverter and to the gate of the transistor having said one conductivity type of said third inverter, and the output from said other terminal of said third CMOS switch is connected to the output from said other terminal of said fourth CMOS switch, to the gate of the transistor having said other conductivity type of said first inverter and to the gate of the transistor having said other conductivity type of said third inverter.

The invention of a twenty-fifth embodiment is characterized by, in addition to the features of the eighteenth embodiment, that the inverter of said first to fourth inverters comprises a p-channel MOS transistor and an n-channel MOS transistor, in which the drive performance of one MOS transistor is larger than the drive performance of the other MOS transistor, when the drive performance of said p-channel MOS transistor is larger than the drive performance of said n-channel transistor, the output of said inverter is connected, either directly or via a CMOS switch, to the gates of p-channel MOS transistors included in each of the inverters contained, between the combination of the first and the third inverters and the combination of the second and the fourth inverters, in the combination of the inverters which does not include said inverter, and when the drive performance of said n-channel MOS transistor is larger than the drive performance of said p-channel transistor, the output of said inverter is connected, either directly or via a CMOS switch, to the gates of n-channel MOS transistors included in each of the inverters contained, between the combination of the first and the third inverters and the combination of the second and the fourth inverters, in the combination of the inverters which does not include said inverter.

The invention of the first embodiment also is an inverter connectable to a power supply having first and second connections, the inverter comprising, a first p-channel MOS transistor having a source, a drain and a gate, the source of the first p-channel MOS transistor adapted to connect to the first connection of the power supply, a first n-channel MOS transistor having a source, a drain and a gate, the source of the first n-channel MOS transistor adapted to connect to the first connection of the power supply, the gate of the first p-channel MOS transistor being connected to the gate of the first n-channel MOS transistor to define an inverter input, and at least one of the first p-channel MOS transistor and the first n-channel MOS transistor forming part of a dual structure by being connected in series, source to drain, with a second MOS transistor of the same conductivity type with the gate of the second MOS transistor being connected to the inverter input.

The invention of the first embodiment also is an inverter connectable to a power supply having first and second connections, the inverter comprising, a first p-channel MOS transistor having a first source, a first drain and a first gate, the first source adapted to connect to the first connection of the power supply, a second p-channel MOS transistor having a second source, a second drain and a second gate, the second source being connected to the first drain, a first n-channel MOS transistor having a third source, a third drain and a third gate, the third source adapted to connect to the second connection of the power supply, a second n-channel MOS transistor having a fourth source, a fourth drain and a fourth gate, the fourth source being connected to the third drain, the gates of all of the MOS transistors being connected to each other to define an inverter input, and the second drain being connected to the fourth drain to define an inverter output.

BRIEF DESCRIPTION OF DRAWING

FIG. 19 is a timing diagram illustrating the operation of data latch circuits 7 and 8.

FIG. 20 is a timing diagram illustrating the operation of data latch circuit 9.

FIG. 21 is a timing diagram illustrating the operation of data latch circuit 11.

DESCRIPTION OF THE PREFERRED EMBODIMENT

Referring now to the circuit diagrams (FIGS. 1 to 11) and the timing diagrams (FIGS. 16 to 21), the configuration and the operation of the inverter, SRAM and data latch circuit according to an embodiment of the present invention will be illustrated in comparison with the prior art. Incidentally, the following symbols will be used for the illustration in the present specification:

A Input;
CK Clock signal;
CKB Input inverted clock signal;
CKBi Inverted clock signal;
D Relative drive performance;
Data Input data signal;
G Clock signal;
GB Input inverted clock signal;
GBi Inverted clock signal;
Out Output;
Q Bit line (SRAM), Clock signal (Data latch circuit);
QB Bit line (SRAM), Inverted clock signal (Data latch circuit);
VDD Supply voltage from the first power supply;
VSS Supply voltage from the second power supply (0V); and
W Word line.

[The Configuration of the Prior Art Inverter]

Figure 1:
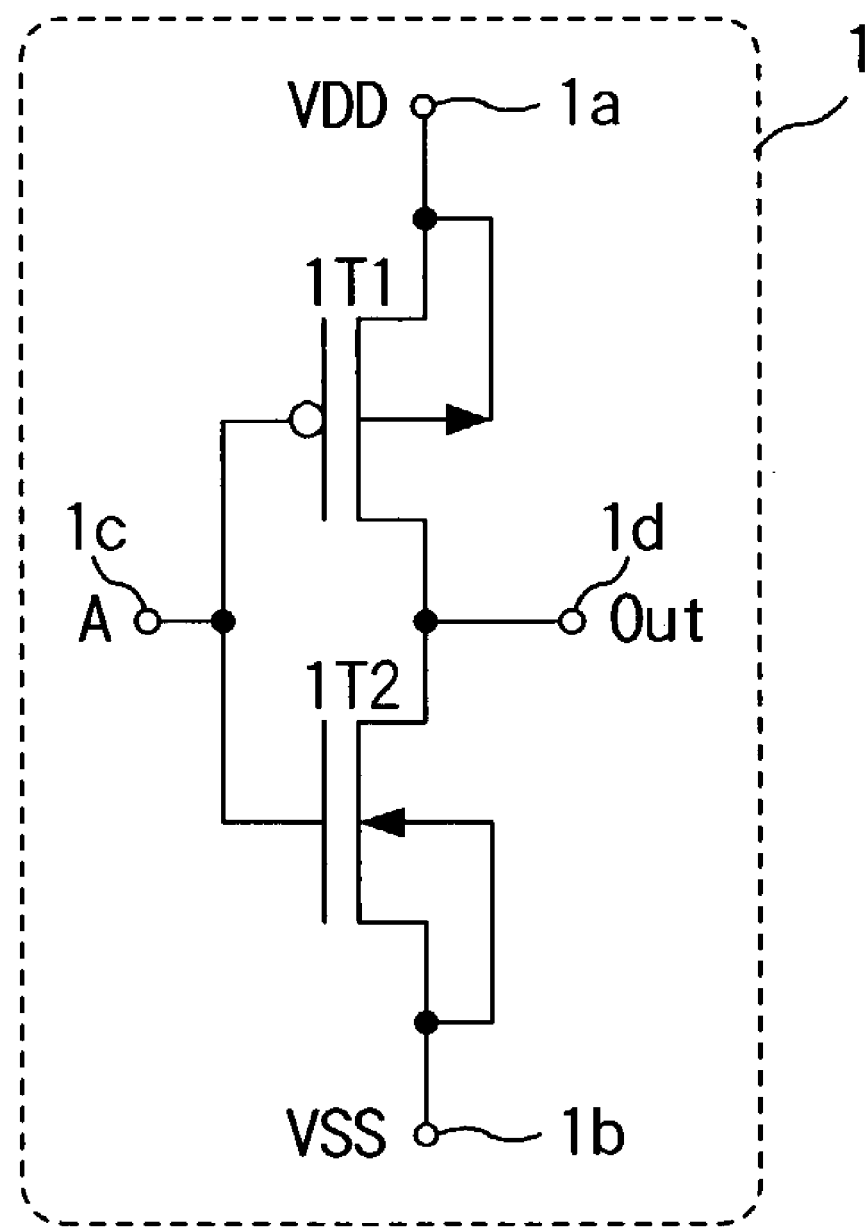
FIG. 1 is a circuit diagram showing the configuration of prior art inverter 1.

First, the configuration of the inverter will be illustrated. FIG. 1 is a circuit diagram showing the configuration of prior art inverter 1. In inverter 1, p-channel MOS transistor 1T1 (hereinafter MOSFET is called "transistor") and n-channel MOS 1T2 transistor are connected in this order in series with respect to the line of a source or drain. The gate of p-channel MOS transistor 1T1 and the gate of n-channel MOS transistor 1T2 are connected in common, and are connected to the input of inverter 1. The node between p-channel MOS transistor 1T1 and n-channel MOS transistor 1T2 on the line of a source or drain is connected to the output of inverter 1.

[The Configuration of the Inverter According to the First Embodiment of the Present Invention]

Figure 2:
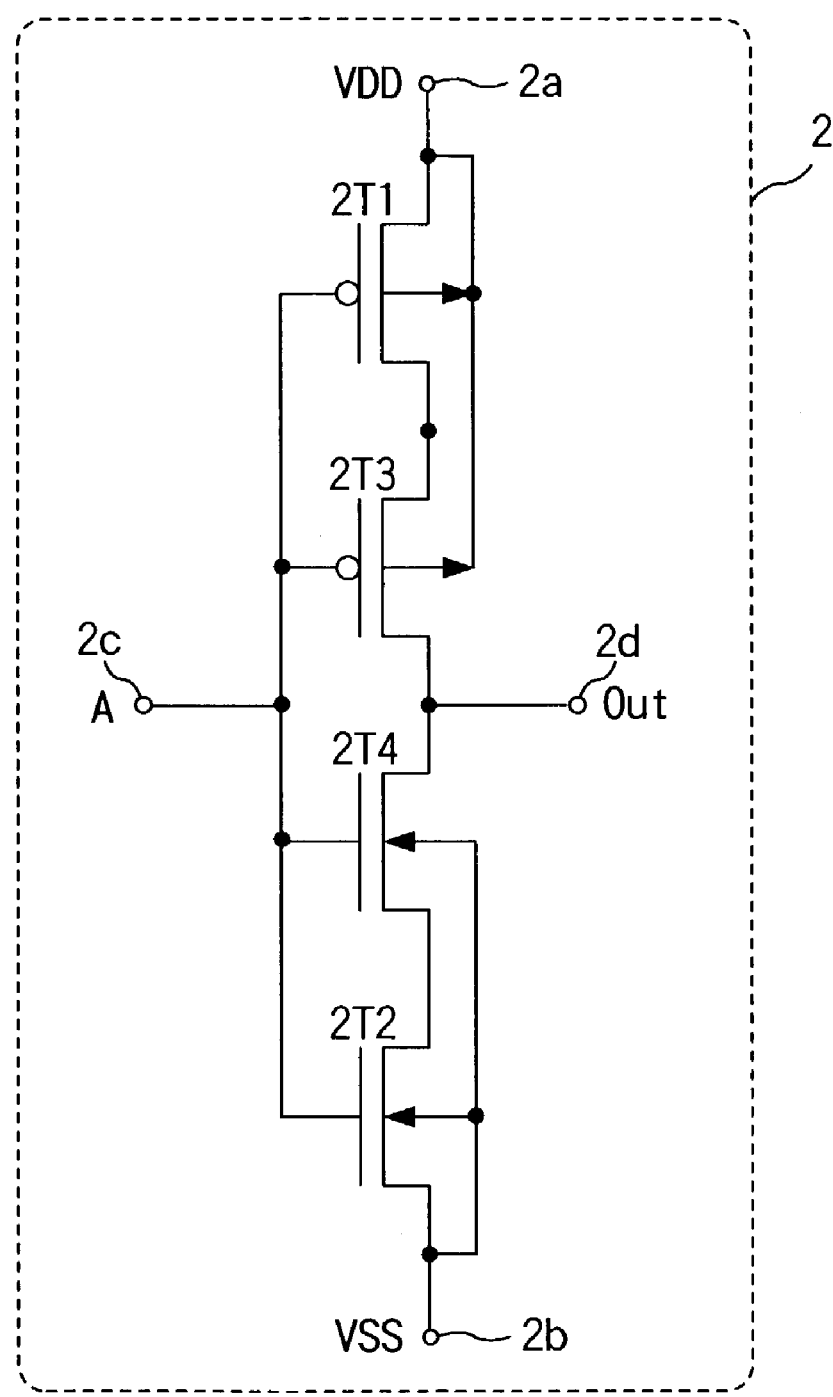
FIG. 2 is a circuit diagram showing the configuration of inverter 2 comprising a transistor having a dual structure according to the first embodiment of the present invention.

FIG. 2 is a circuit diagram showing the configuration of inverter 2 comprising a transistor having a dual structure according to the first embodiment of the present invention. In inverter 2, (p-channel MOS) transistor 2T1, which corresponds to transistor 1T1 in inverter 1, constitutes a dual structure by being connected with transistor 2T3 having a channel of the same conductivity type (p-channel MOS) in series with respect to the line of a source or drain, and their gates being connected to each other. These two transistors, 2T1 and 2T3, execute the same operation as they were a single transistor as a whole, because their gates are connected in common, and the line of a source or drain controlled by the gates are connected in series to each other. Here, for example, when transistors 2T1 and 2T3 are off status (of non-continuity), and thus off status as a whole, even if either of these transistors becomes on status (of continuity) by malfunction due to a single event, the off status can be retained as a whole since the other transistor is off. Therefore, in inverter 2, a redundant system is formed by providing transistor with a dual structure, and thus the change in the logical status of the output without intention due to the single event is prevented.

As transistor 2T1 is connected in series with transistor 2T3, so (n-channel MOS) transistor 2T2 is connected with (n-channel MOS) transistor 2T4 in series with respect to the line of a source or drain. Namely, each of transistors 2T1 and 2T2 in inverter 2, which corresponds to transistors 1T1 and 1T2 in inverter 1 respectively, constitutes a dual structure by being connected with transistors 2T3 and 2T4 having same conductivity type. As in inverter 1, input A is connected to node 2c in inverter 2, and output Out is connected to node 2d in inverter 2. Supply voltage VDD is applied to node 2a from the first power supply, and supply voltage VSS is applied to node 2b from the second power supply. VSS is usually 0V.

[The Configuration of the Inverter According to the Second Embodiment of the Present Invention]

Figure 3:
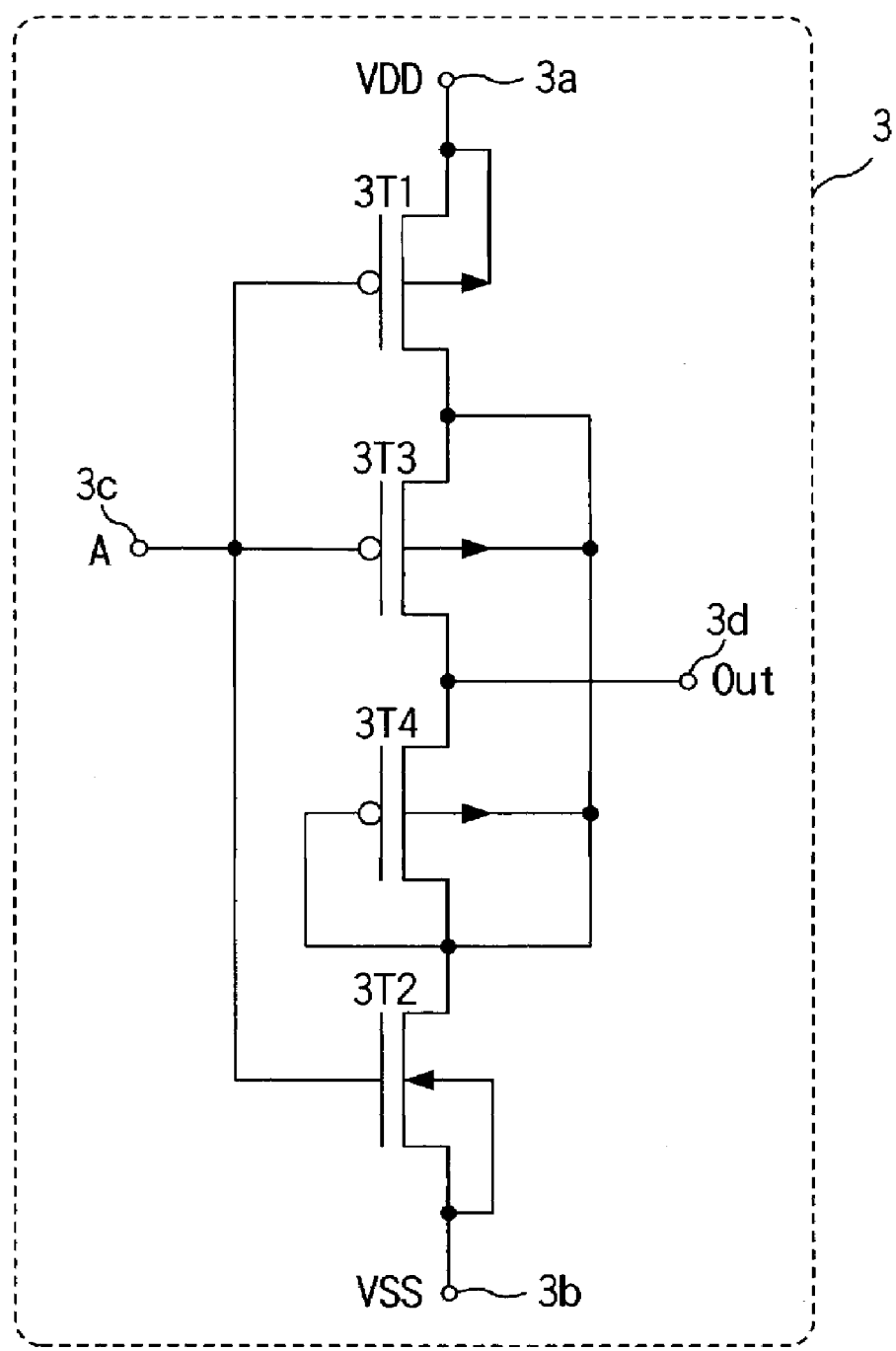
FIG. 3 is a circuit diagram showing the configuration of inverter 3 comprising a transistor having a dual structure according to the second embodiment of the present invention.

FIG. 3 is a circuit diagram showing the configuration of inverter 3 comprising a transistor having a dual structure according to the second embodiment of the present invention. In inverter 3, (p-channel MOS) transistor 3T1, which corresponds to transistor 1T1 in inverter 1, constitutes a dual structure by being connected with (p-channel) MOS transistor 3T3 in series with respect to the line of a source or drain at the node on the side of the second power supply, and their gates being connected to each other.

In addition, (n-channel) MOS transistor 3T2, which corresponds to transistor 1T2 in inverter 1, constitutes a dual structure by being connected with p-channel MOS transistor 3T4 in series with respect to the line of a source or drain at the node on the side of the first power supply, and the gate of this p-channel MOS transistor being connected in common to the node of transistor 3T2 on the side of the first power supply and the node of p-channel MOS transistor 3T1 on the side of the second power supply. As in inverter 1, input A is connected to node 3c in inverter 3, and output Out is connected to node 3d in inverter 3. Supply voltage VDD is applied to node 3a from the first power supply, and supply voltage VSS is applied to node 3b from the second power supply. VSS is usually 0V. The substrate (bulk) of tow p-MOS transistors 3T3 and 3T4 for the dual structure is, as is different from the case of p-MOS transistor 3T1, independent from the first supply voltage VDD.

[The Operation of the Prior Art Inverter]

Figure 16:
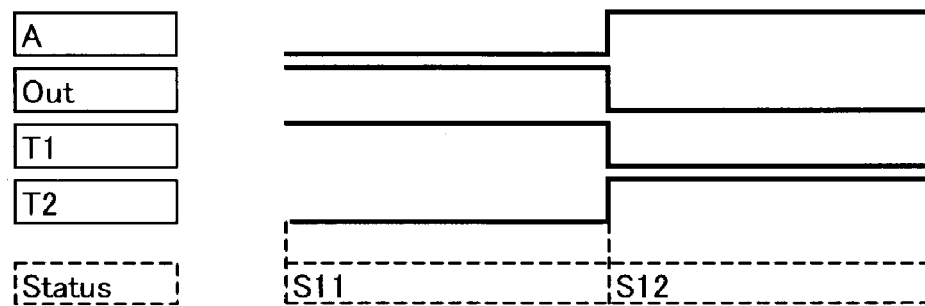
FIG. 16 is a timing diagram illustrating the operation of inverter 1.
Figure 17:
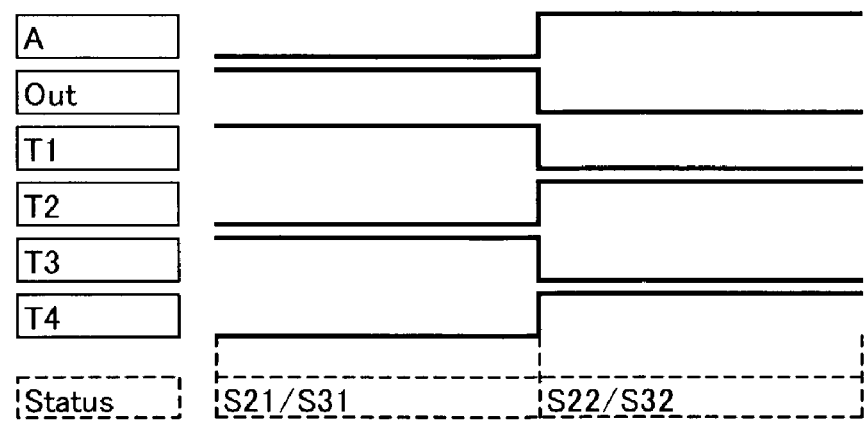
FIG. 17 is a timing diagram illustrating the operation of inverters 2 and 3.

The operation of the inverter will be illustrated next. FIG. 16 is a timing diagram illustrating the operation of inverter 1, and FIG. 17 is a timing diagram illustrating the operation of inverters 2 and 3. In this connection, since the important thing for illustrating the present invention is not the transient characteristics of the voltage change but the transition of the logical status, only the change in the logical status (high level, low level) is shown in FIGS. 16 to 21. In FIG. 16, input A corresponds to node 1c, and output Out corresponds to node 1d. Each of T1 to T2 corresponds to transistor 1T1 to 1T2 in inverter 1, respectively. In FIG. 17, input A corresponds to node 2c or 3c, and output Out corresponds to node 2d or 3d. Each of T1 to T4 corresponds to transistor 2T1 to 2T4 in inverter 2 and transistor 3T1 to 3T4 in inverter 3, respectively. In this connection, the logical status of the transistor is illustrated by corresponding the off status of the transistor to the low level and the on status to the high level.

[Inverters 1 to 3—Status S11—Normal Operation]

By shifting the status of inverters 1, 2 and 3 to status S11 to S12 shown in FIG. 16 for inverter 1 and to status S21/S31 to S22/S32 shown in FIG. 17 for inverters 2 and 3, the operation of inverters 1, 2 and 3 in each of the status will be illustrated. First, in status S1, input A is at a low level. Thus, in inverter 1, 2 and 3, transistors 1T1, 2T1 and 3T1 are on, while transistors 1T2, 2T2 and 3T2 are off In addition, in inverter 2 and 3, transistors 2T3 and 3T3 are on, while transistors 2T4 and 3T4 are off. Furthermore, supply voltage VDD from the first power supply, namely a high level, is output from nodes 1d, 2d and 3d to output Out. Thus, input A of a low level is inverted, and output Out becomes a high level.

[Inverters 1—Status S11—Single Event]

Here, the possibility of the occurrence of single event on inverter 1 in status S11 will be examined. In status S11, input A is at a low level, 1T1 is on, 1T2 is off, and output Out is at a high level. Suppose transistor 1T2 of off status is irradiated by high energy particles, and as a result, it becomes on. At that moment, the output of inverter 1 is connected also to VSS of ground voltage, and thus the output level of inverter 1 falls off instantly. Since this fallen off voltage is output to a downstream, if the voltage falls off below the threshold, the logical value is inverted. As such, malfunction of one transistor 1T2 adversely affects the output of inverter 1, and as a result, the logical value output from the inverter is inverted. This phenomenon is single event, and inverter 1 is subject to the phenomenon.

[Inverters 2—Status S11—Single Event]

Next, the possibility of the occurrence of single event on inverter 2 in status S11 will be examined. In status S11, input A is at a low level, 2T1 and 2T3 are on, 2T2 and 2T4 are off, and output Out is at a high level. Suppose, when transistors 2T2 and 2T4 are in off status, transistor 2T2 is irradiated by high energy particles, and as a result, it becomes on. In this case, since transistor 2T4, which is connected with transistor 2T2 in series with respect to the line of a source or drain, remains off, and thus the change in the level due to the malfunction of transistor 2T2 is blocked by transistor 2T4, the change does not reach to output Out. Therefore, even if transistor 2T2 becomes on instantly, the effect resulted will stay inside transistor 2T2 itself, and thus transistors 2T2 and 2T4 as a whole, or output Out of inverter 2, will not be adversely affected. In addition, even if transistor 2T4 becomes on, the effect resulted will be blocked by transistor 2T2. As such, even when one of the transistors malfunctions as described above, the result from the malfunction will be blocked by the transistor which is connected with that transistor in series with respect to the line of a source or drain for forming the dual structure. As a result, the occurrence of single event is prevented in this manner.

[Inverters 3—Status S11—Single Event]

Next, the possibility of the occurrence of single event on inverter 3 in status S11 will be examined. In status S11, input A is at a low level, 3T1 and 3T3 are on, 3T2 and 3T4 are off, and output Out is at a high level. Suppose transistor 3T2 is irradiated by high energy particles, and as a result, it becomes on. In this case, although the voltage at the node of transistor 3T2 on the side of VDD falls off, the fallen voltage is blocked by transistor 3T4 and thus does not reach to output Out. In addition, even if transistor 3T4 becomes on, because the node of transistor 3T4 on the side of VSS is at a high level since it is connected with the node of transistor 3T1 on the side of VSS which is on, output Out will not be changed and remains a high level. Namely, node 3d connected with output Out is protected by two p-MOS transistors 3T3 and 3T4 which sandwich the node between them, and thus will not be affected by noise. As a result, the occurrence of single event is prevented in this manner.

[Inverters 1 to 3—Status S12—Normal Operation]

Next, the transition of the status of inverters 1, 2 and 3 to status S12 results in input A having a high level. As a result, in inverter 1, 2 and 3, transistors 1T1, 2T1 and 3T1 become off, while transistors 1T2, 2T2 and 3T2 become on. In addition, in inverter 2 and 3, transistors 2T3 and 3T3 are off, while transistors 2T4 and 3T4 are on. Furthermore, supply voltage VSS from the second power supply, namely a low level, is output from nodes 1d, 2d and 3d to output Out. Thus, input A of a high level is inverted, and output Out becomes a low level.

[Inverters 1—Status S12—Single Event]

Here, the possibility of the occurrence of single event on inverter 1 in status S12 will be examined. In status S12, input A is at a high level, 1T1 is off, 1T2 is on, and output Out is at a low level. Suppose transistor 1T1 of off status is irradiated by high energy particles, and as a result, it becomes on. At that moment, the output of inverter 1 is connected also to VDD, and thus the output level of inverter 1 rises instantly. Since this raised voltage is output to a downstream, if the voltage rose above the threshold, the logical value is inverted. As such, inverter 1 is subject to the occurrence of single event phenomenon.

[Inverters 2—Status S12—Single Event]

Next, the possibility of the occurrence of single event on inverter 2 in status S12 will be examined. In status S12, input A is at a high level, 2T1 and 2T3 are off, 2T2 and 2T4 are on, and output Out is at a low level. Suppose, when transistors 2T1 and 2T3 are in off status, transistor 2T1 is irradiated by high energy particles, and as a result, it becomes on. In this case, since transistor 2T3, which is connected with transistor 2T1 in series with respect to the line of a source or drain, remains off, and thus the change in the level due to the malfunction of transistor 2T1 is blocked by transistor 2T3, the change does not reach to output Out. Therefore, even if transistor 2T1 becomes on instantly, the effect resulted will stay inside transistor 2T1 itself, and thus transistors 2T1 and 2T3 as a whole, or output Out of inverter 2, will not be adversely affected. In addition, even if transistor 2T3 becomes on, the effect resulted will be blocked by transistor 2T1. As such, even when one of the transistors malfunctions as described above, the result from the malfunction will be blocked by the transistor which is connected with that transistor in series with respect to the line of a source or drain for forming the dual structure. As a result, the occurrence of single event is prevented in this manner.

[Inverters 3—Status S12—Single Event]

Next, the possibility of the occurrence of single event on inverter 3 in status S12 will be examined. In status S12, input A is at a high level, 3T1 and 3T3 are off, 3T2 and 3T4 are on, and output Out is at a low level. Suppose transistor 3T1 is irradiated by high energy particles, and as a result, it becomes on. In this case, although the voltage at the node of transistor 3T1 on the side of VSS rises, the raised voltage is blocked by transistor 3T3 and thus does not reach to output Out. In addition, even if transistor 3T3 becomes on, because the node of transistor 3T3 on the side of VDD is at a low level since it is connected with the node of transistor 3T2 on the side of VDD which is on, output Out will not be changed and remains a low level. Namely, node 3d connected with output Out is protected by two p-MOS transistors 3T3 and 3T4 which sandwich the node between them, and thus will not be affected by noise. As a result, the occurrence of single event is prevented in this manner.

[The Configuration of the Prior Art SRAM]

Figure 4:
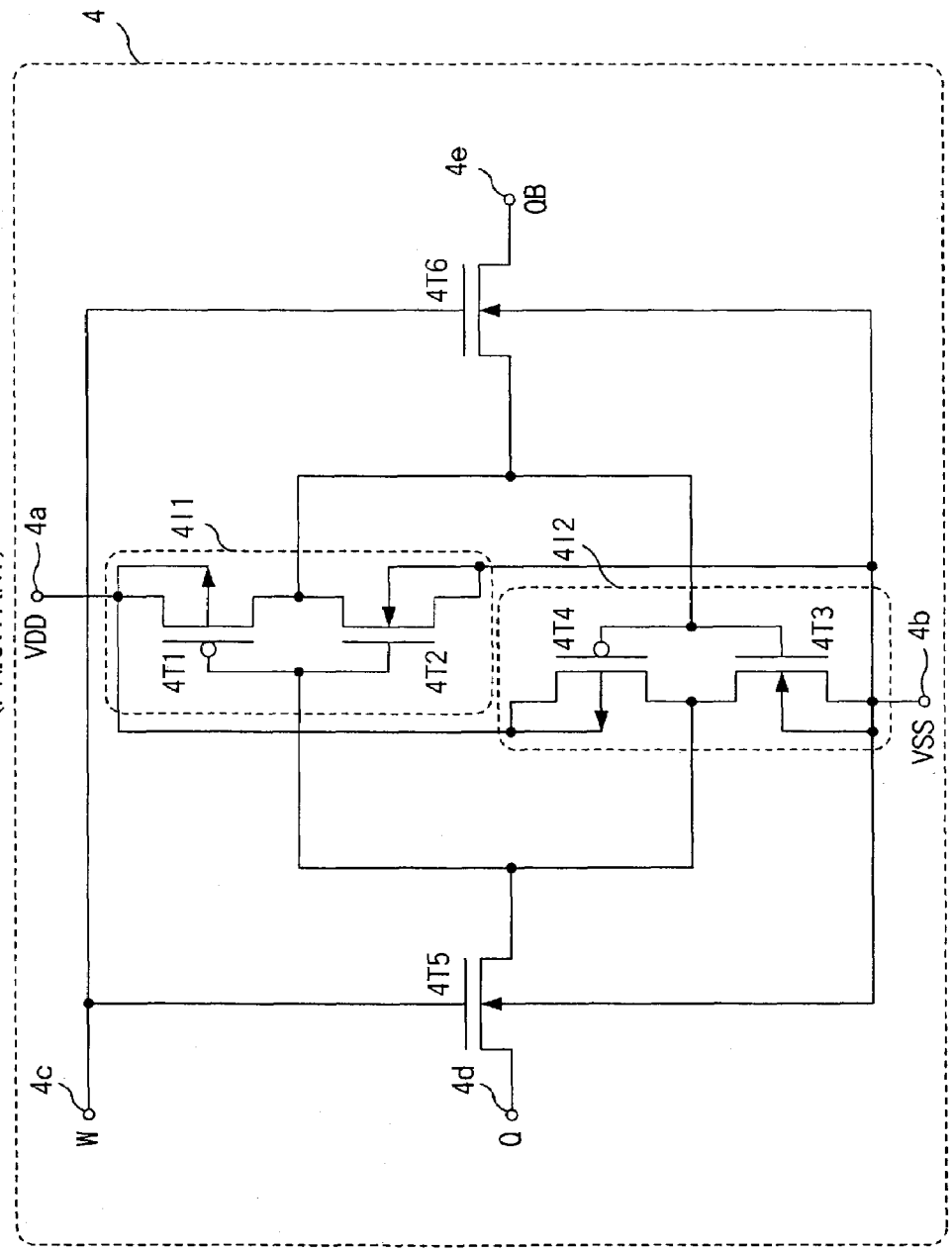
FIG. 4 is a circuit diagram showing the configuration of prior art SRAM 4 having complete CMOS-type cell structure.

First, the configuration of the SRAM will be illustrated. FIG. 4 is a circuit diagram showing the configuration of prior art SRAM 4 having complete CMOS-type cell structure. Generally, SRAM comprises a flip-flop, in which the input and the output of two inverters are cross-connected to each other, and two transistors are connected to each of two input and output terminals of the flip-flop, such that each of the gates (gate transfer) is connected to the same word line, and each of the two input and output terminal is connected to the bit line via the control by the gate. In a complete CMOS-type SRAM cell employing CMOS structure as an inverter, one inverter consists of two transistors having different conductivity type, and in a high resistance load-type SRAM cell employing a load resistance element of high resistance as a load for an inverter, one inverter consists of one transistor and one load resistance element. Therefore, a complete COMS-type SRAM cell comprises six transistors, while a high resistance load-type SRAM cell comprises four transistors. In SRAM 4 shown FIG. 4, the input and the output are cross-connected to each other between inverter 4I1 of CMOS structure comprising (p-channel MOS) transistor 4T1 and (n-channel MOS) transistor 4T2 and inverter 4I2 comprising transistor 4T3 and transistor 4T4. These inverters have the same configurations as above-described inverter 1, and constitute a flip-flop by being cross-connected as such. The output terminal of inverter 4I1 is connected via transistor 4T6 to node 4e which leads to bit line QB ("B" attached next to "Q" stands for "over bar", meaning inverted, hereinafter the same.), and the output terminal of inverter 4I2 is connected via transistor 4T5 to node 4d which leads to bit line Q. The gates of transistor 4T5 and transistor 4T6 are connected to node 4c which leads to word line W. Supply voltage VDD is applied to node 4a from the first power supply, and supply voltage VSS is applied to node 4b from the second power supply. VSS is usually 0V.

[The Configuration of SRAM According to an Embodiment of the Present Invention]

Figure 5:
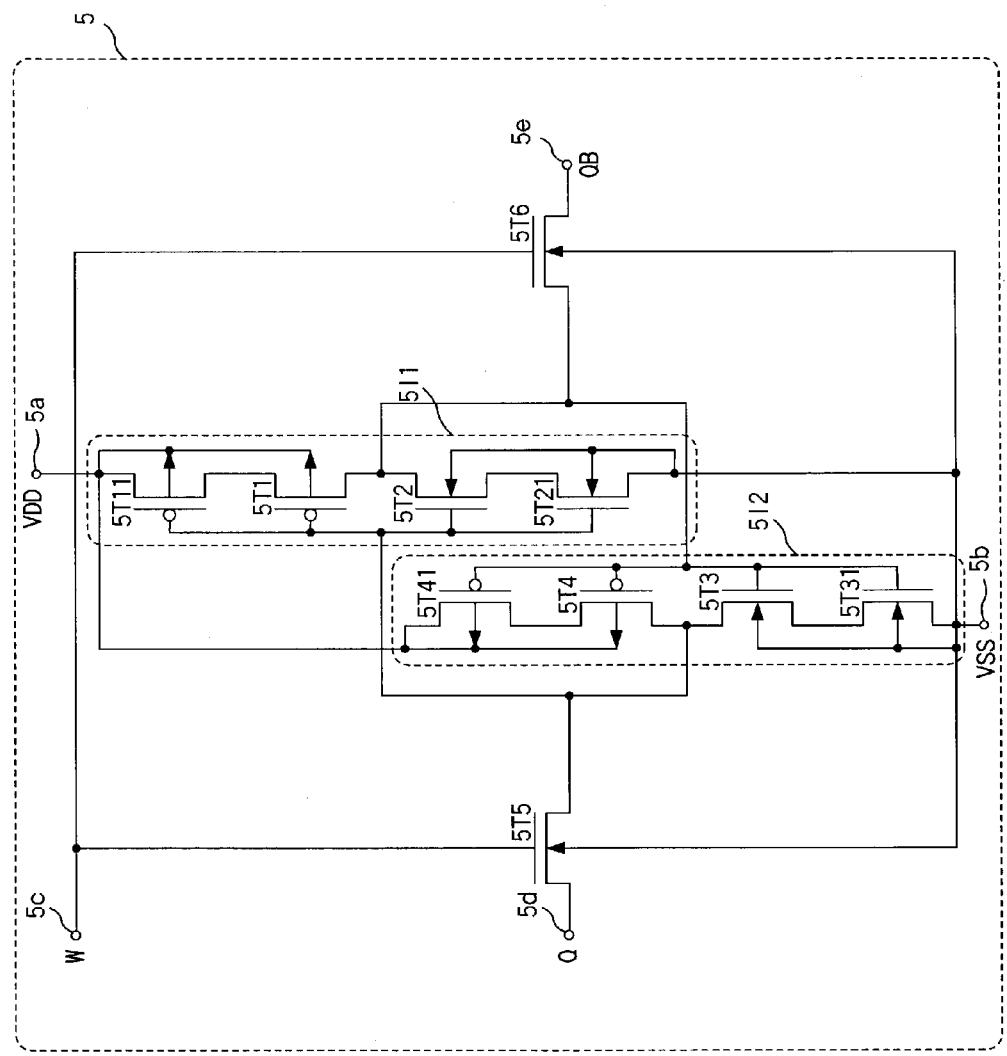
FIG. 5 is a circuit diagram showing the configuration of SRAM 5 having complete CMOS-type cell structure and comprising the transistor having a dual structure according to the third embodiment of the present invention.

FIG. 5 is a circuit diagram showing the configuration of SRAM 5 having complete CMOS-type cell structure and comprising the transistor having a dual structure according to the third embodiment of the present invention. The structure of SRAM 5 is obtained by replacing inverters 4I1 and 4I2 in SRAM 4 with inverters 5I1 and 5I2, respectively.

Inverters 5I1 and 5I2 are inverters having the dual structure, as is above-described inverter 2. Therefore, in SRAM 5, a redundant system is formed by providing transistor with a dual structure, and thus the change in the logical status of the output without intention due to the single event is prevented. In inverters 5I1 and 5I2 having the dual structure, similar to the case of SRAM 4, the input and the output are cross-connected to each other, and thus a flip-flop is formed. As in the case of SRAM 4, the output terminal of inverter 5I1 is connected via transistor 5T6 to node 5e which leads to bit line QB, and the output terminal of inverter 5I2 is connected via transistor 5T5 to node 5d which leads to bit line Q. The gates of transistor 5T5 and transistor 5T6 are connected to node 5c which leads to word line W. Supply voltage VDD is applied to node 5a from the first power supply, and supply voltage VSS is applied to node 5b from the second power supply. VSS is usually 0V.

[The Operation of SRAM According to the Third Embodiment of the Present Invention]

Figure 18:
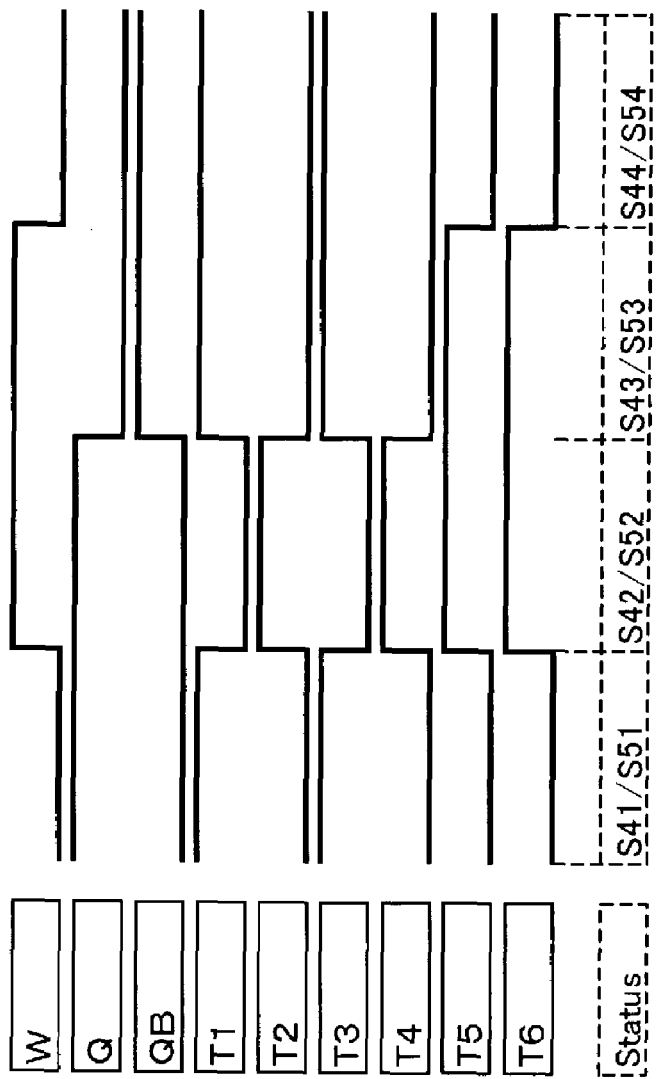
FIG. 18 is a timing diagram illustrating the operation of SRAMs 4 and 5.

The operation of the SRAM will be illustrated next. FIG. 18 is a timing diagram illustrating the operation of SRAMs 4 and 5. In this connection, since the important thing for illustrating the present invention is not the transient characteristics of the voltage change but the transition of the logical status, only the change in the logical status (high level, low level) is shown in FIG. 18. In FIG. 18, word line W corresponds to nodes 4c and 5c, bit line Q corresponds to nodes 4d and 5d, and bit line QB corresponds to nodes 4e and 5e. Each of T1 to T6 corresponds to transistor 4T1 to 4T6 in SRAM 4 and transistor 5T1 to 5T6 in SRAM 5, respectively. In this connection, the logical status of T1 to T6 is illustrated by corresponding the off status of the transistor to the low level and the on status to the high level.

[SRAMs 4 and 5—Status S41/S51—Normal Operation]

By shifting the status of SRAMs 4 and 5 to status S41 to S44 and S51 to S54, the operation of SRAMs 4 and 5 in each of the status will be illustrated. First, in status S41 and S51, word line W is at a low level. Thus, since transistors 4T5 and 4T6 in SRAM 4 and transistors 5T5 and 5T6 in SRAM 5 are off, even if the logical status of bit lines Q and QB has been changed, such change will not reach to the flip-flop in SRAMs 4 and 5. In addition, the logical status of the flip-flop in SRAMs 4 and 5 will not reach to bit lines Q and QB, either. Namely, in this occasion, SRAMs 4 and 5 cannot execute writing and reading of data, and is in the status of data retaining, such that the logic status inside the flip-flop is retained.

[SRAM 4—Status S41—Normal Operation]

In SRAM 4, since transistor 4T1 is on and transistor 4T2 is off, the output of inverter 4I1 is at a high level. This output voltage of a high level enters into the input of inverter 4I2, turns transistor 4T3 on and transistor 4T4 off. As a result, the output of inverter 4I2 becomes a low level. Since this output voltage of a low level then enters into the input of inverter 4I1, it supports the above-described "on" operation of transistor 4T1 and "off" operation of transistor 4T2, and thus retains the status of the flip-flop stably. Although bit line Q is at a high level and bit line QB is at a low level, these logical statuses do not reach to inverters 4I1 and 4I2 because word line W is at a low level. As a result, despite that the logical statuses of inverters 4I1 and 4I2 are opposite to the logical statuses of bit lines Q and QB, these statuses are retained stably.

[SRAM 4—Status S41—Single Event]

Here, the possibility of the occurrence of single event on SRAM 4 in status S41 will be examined. Suppose transistor 4T2 of off status is irradiated by high energy particles, and as a result, it becomes on. Since inverter 4I1 comprising transistor 4T2 has the same structure as the above-described inverter 1, the output level of inverter 4I1 can fall off below the threshold, where the logical value is inverted. In this case, since this fallen off output voltage enters into the input of inverter 4I2, it turns transistor 4T3 from on to off and transistor 4T4 from off to on. As a result, the output of inverter 4I2 becomes a high level. Because this output voltage of a high level then enters into the input of inverter 4I1, it turns transistor 4T1 from on to off, and fixes transistor 4T2 to on, which has been turned from off to on instantly due to the high energy particles. As such, malfunction of one transistor 4T2 adversely affects throughout the flip-flop, and as a result, the logical value of the flip-flop is inverted. This is single event, and SRAM 4 is subject to the phenomenon.

[SRAM 5—Status S51—Normal Operation]

In SRAM 5, similar to SRAM 4, since transistors 5T1 and 5T11 are on and transistors 5T2 and 5T21 are off, the output of inverter 5I1 is at a high level. This output voltage of a high level enters into the input of inverter 5I2, turns transistors 5T3 and 5T3 Ion and transistors 5T4 and 5T41 off. As a result, the output of inverter 5I2 becomes a low level. Since this output voltage of low level enters into the input of inverter 5I1, it supports the above-described "on" operation of a transistor 5T1 and "off" operation of transistor 5T2, and thus retains the status of the flip-flop stably.

[SRAM 5—Status S51—Single Event]

Here, the possibility of the occurrence of single event on SRAM 5 in status S51 will be examined. Suppose, when transistors 5T2 and 5T21 are in off status, transistor 5T2 is irradiated by high energy particles, and as a result, it becomes on. Since inverter 5I1 comprising transistors 5T2 and 5T21 has the same dual structure as above-described inverter 2, the output of inverter 5I1 will not be changed. Therefore, even if transistor 5T2 becomes on instantly, the effect resulted will stay inside transistor 5T2 itself, and thus inverter 5I1 or the flip-flop will not be adversely affected. Even when one of the transistors in the flip-flop malfunctions as described above, the result from the malfunction will be blocked by the transistor for forming the dual structure. As a result, the occurrence of single event is prevented in this manner.

[SRAMs 4 and 5—Status S42/52—Normal Operation]

Then, word line W is turned to be a high level (status S42/S52). As a result, transistors 4T5 and 4T6 in SRAM 4 and transistors 5T5 and 5T6 in SRAM 5 become on, the change in the logical status of bit lines Q and QB are transferred to the flip-flop in SRAMs 4 and 5, and the logical status of the flip-flop becomes readable from bit lines Q and QB. Namely, at this time, SRAMs 4 and 5 are ready for writing and reading data.

Here, since bit line Q is at a high level while bit line QB is at a low level, these statuses are transferred to inverters 4I1 and 4I2 in SRAM 4 and inverters 5I1 and 5I2 in SRAM 5. As a result, transistors 4T1, 5T1 and 5T11 turn from on to off, transistors 4T2, 5T2 and 5T21 turn from off to on, and the outputs of inverters 4I1 and 5I1 become a low level. This output voltage of a low level, together with the output voltage from bit line QB which is also of a low level, enter into the inputs of inverters 4I2 and 5I2, and turn transistor 4T3, 5T3 and 5T31 from on to off and transistor 4T4, 5T4 and 5T41 from off to on. As a result, the output of inverter 4I2 becomes a high level. Since this output voltage of a high level, together with the output voltage from bit line Q which is also of a high level, enter into the input of inverter 4I1, they support the above-described "off" operation of transistor 4T1 and "on" operation of transistor 4T2, and retain the status of the flip-flop stably. These are the same in the case of inverter 5I1. These operations accomplish to write data represented by the potential difference between bit lines Q and QB to SRAMs 4 and 5. On the other hand, data can be read from SRAMs 4 and 5 by detecting the potential difference between bit lines Q and QB.

[SRAMs 4 and 5—Status S42/S52—Single Event]

Here, the possibility of the occurrence of single event on SRAMs 4 and 5 in status S42/S52 will be examined. When SRAMs 4 and 5 are in the operation of writing, namely, when the potential difference is applied between bit lines Q and QB, even if the inverter malfunctions instantly due to the irradiation by high energy particles, single event will not be readily manifested because the logical status of the flip-flop is eventually defined by the potential difference between bit lines Q and QB. On the other hand, when SRAMs 4 and 5 are in the operation of reading, namely, when the potential difference between bit lines Q and QB are detected, if there is an irradiation by high energy particles, SRAM 4 is subject to the occurrence of single event based on the same mechanism as the one in the above-described illustration for the single event in status S41, while for SRAM 5, even when one of the transistors in the inverter malfunctions, the result from the malfunction will be blocked by the transistor for forming the dual structure, and thus the occurrence of single event is prevented effectively.

[SRAMs 4 and 5—Status S43/53—Normal Operation]

Next, with word line W kept at a high level (SRAMs 4 and 5 are ready for writing and reading data.), bit line Q is changed from a high level to a low level, and bit line QB is changed from a low level to a high level (status S43/S53). Since the change in the logical status of bit lines Q and QB are transferred to the flip-flop, transistors 4T1, 5T1 and 5T11 turn from off to on, transistors 4T2, 5T2 and 5T21 turn from on to off, and the outputs of inverters 4I1 and 5I1 become a high level. This output voltage of a high level, together with the output voltage from bit line QB which is also of a high level, enter into the inputs of inverters 4I2 and 5I2, and turn transistor 4T3, 5T3 and 5T31 from off to on and transistor 4T4, 5T4 and 5T41 from on to off. As a result, the outputs of inverters 4I2 and 5I2 become a low level. Since this output voltage of a low level, together with the output voltage from bit line Q which is also of a low level, enter into the inputs of inverters 4I1 and 5I1, they support the above-described "on" operation of transistors 4T1, 5T1 and 5T11 and "on" operation of transistors 4T2, 5T2 and 5T21, and retain the status of the flip-flop stably. These are the same in the case of inverter 5I1. These operations accomplish to write data represented by the potential difference between bit lines Q and QB to SRAMs 4 and 5. On the other hand, data can be read from SRAMs 4 and 5 by detecting the potential difference between bit lines Q and QB.

[SRAMs 4 and 5—Status S43/S53—Single Event]

Here, as for the possibility of the occurrence of single event on SRAMs 4 and 5 in status S43/S53, as in the case of status S42/S52, when SRAMs 4 and 5 are in the operation of writing, single event will not be readily manifested. On the other hand, when SRAMs 4 and 5 are in the operation of reading, SRAM 4 is subject to the occurrence of single event, while for SRAM 5, the occurrence of single event is prevented effectively because of the dual structure of the transistor.

[SRAMs 4 and 5—Status S44/S54—Normal Operation]

Next, with bit line Q kept at a low level and bit line QB at a high level, word line W is changed from a high level to a low level (status S44/S54). As a result, as in the case of status S41/S51, transistors 4T5 and 4T6 in SRAM 4 and transistors 5T5 and 5T6 in SRAM 5 become off, and even if the logical status of bit lines Q and QB has been changed, such change will not reach to the flip-flop in SRAMs 4 and 5. In addition, the logical status of the flip-flop in SRAMs 4 and 5 will not reach to bit lines Q and QB, either. Namely, in this occasion, SRAMs 4 and 5 cannot execute writing and reading of data, and is in the status of data retaining, such that the logic status inside the flip-flop is retained, and thus the output of inverter 4I1 is retained as a high level and the output of inverter 4I2 is retained as a low level in SRAM 4. These are the same for SRAM 5.

[SRAMs 4 and 5—Status S44/S54—Single Event]

Here, as for the possibility of the occurrence of single event on SRAMs 4 and 5 in status S44/S54, as in the case of status S41/S51, SRAM 4 is subject to the occurrence of single event, while for SRAM 5, the occurrence of single event is prevented effectively because of the dual structure of the transistor.

[SRAMs According to Other Embodiments]

SRAM 5 is obtained by replacing the inverter in the prior art SRAM 4 with inverter 2 comprising the transistor having a dual structure according to the first embodiment of the present invention. Other SRAMs include the SRAM obtained by replacing the inverter in SRAM 4 with inverter 3 comprising the transistor having a dual structure according to the second embodiment of the present invention. In the operation of such SRAMs, as in the case of SRAM 4, the occurrence of single event is prevented.

[The Configuration of the Prior Art Data Latch Circuit]

Figure 6:
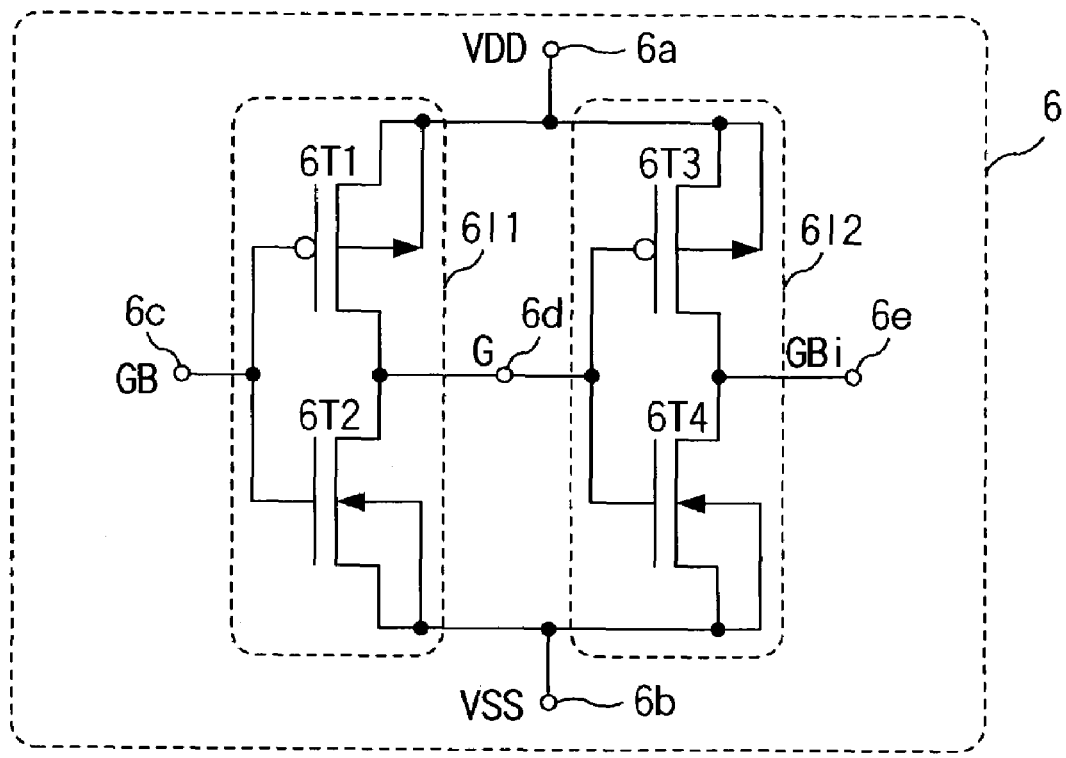
FIG. 6 is a circuit diagram showing the configuration of buffer circuit 6 which generates complementary clock and inverted clock signals having shaped waveform to be supplied to data latch circuits 7, 8 and 9.

Next, the data latch circuit will be illustrated. First, the configuration of the data latch circuit is illustrated. FIG. 6 is a circuit diagram showing a typical configuration of buffer circuit 6 which generates complementary clock and inverted clock signals having shaped rising and falling waveforms of the signal to be supplied to data latch circuit. Buffer circuit 6 has a configuration where the output of inverter 6I1 comprising transistors 6T1 and 6T2 is cascade-connected to inverter 6I2 comprising transistors 6T3 and 6T4. Buffer circuit 6 comprises node 6c to which input inverted clock signal GB is supplied, node 6e which outputs clock signal G having shaped waveform, node 6e which outputs inverted clock signal GBi having shaped waveform, node 6a to which supply voltage from the first power supply VDD is supplied, and node 6b to which supply voltage from the second power supply VSS is supplied. VSS is usually 0V.

Figure 7:
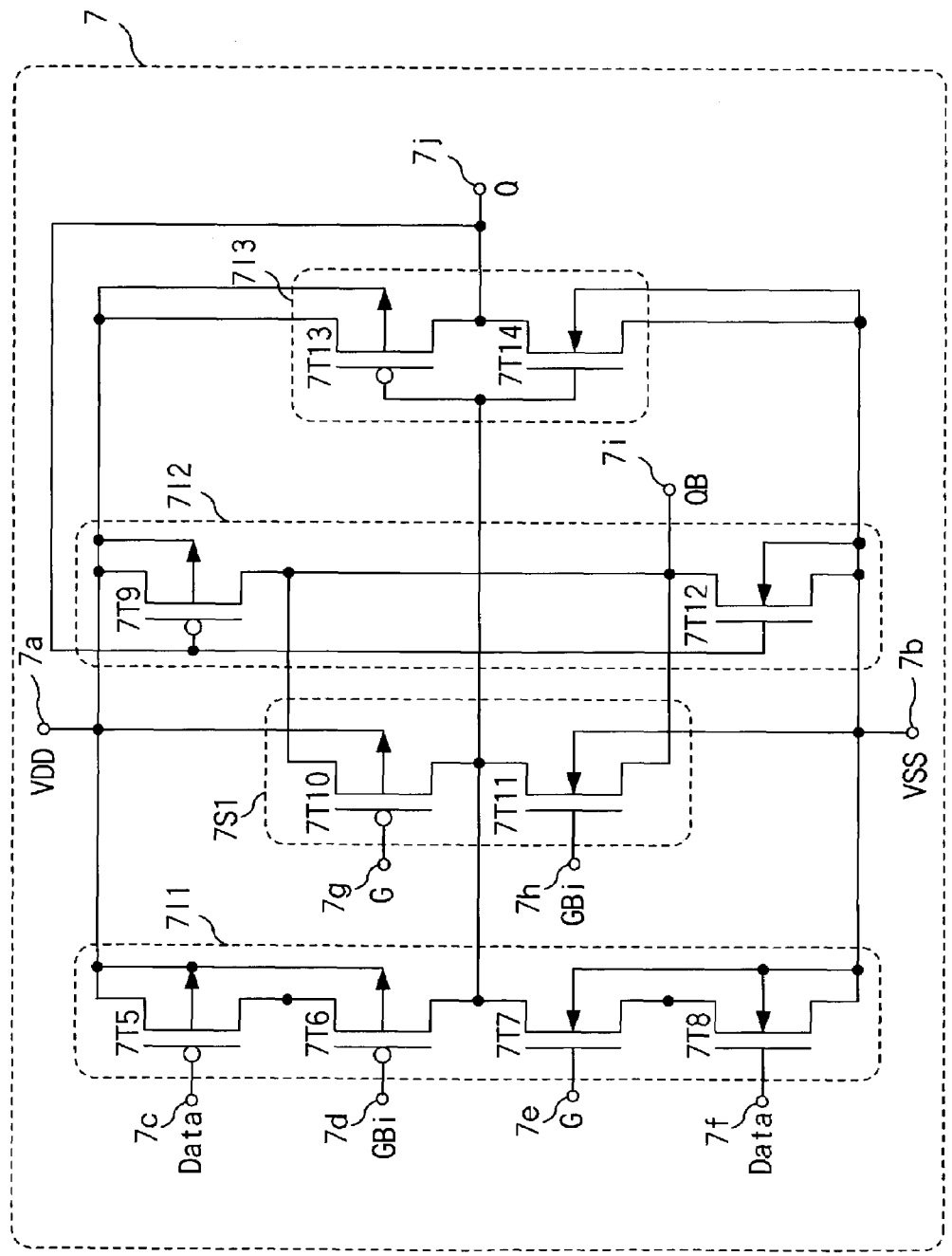
FIG. 7 is a circuit diagram showing an example for the configuration of prior art data latch circuit 7.

FIG. 7 is a circuit diagram showing a typical configuration of prior art data latch circuit 7. Data latch circuit 7 has clocked inverter 7I1 comprising four transistors (7T5, 7T6, 7T7 and 7T8), and clocked inverter 7I1 has node 7c (connected to the gate of transistor 7T5) and node 7f (connected to the gate of transistor 7T8) to which input data signal Data is supplied, and node 7d (connected to the gate of transistor 7T6) and 7e (connected to the gate of transistor 7T7), to which complementary clock signals for control Gbi, G are supplied, respectively. Data latch circuit 7 has inverter 7I2 comprising transistors 7T9 and 7T12, inverter 7I3 comprising transistors 7T13 and 7T14, and CMOS switch 7S1 comprising transistors 7T10 and 7T11. The output of inverter 7I3 is connected directly to the input of inverter 7I2, and the output of inverter 7I2 is connected to the input of inverter 7I3 via CMOS switch 7S1, which is controlled by the complementary clock signals G, Gbi having logic contrary to complementary clock signals Gbi, G supplied to clocked inverter 7I1. With such connections, inverters 7I2 and 7I3 form a flip-flop (latch) by positive feedback loop. The output of clocked inverter 7I1 is connected to one input of flip-flop, namely the input of inverter 7I3 (and the output of inverter 7I2 via CMOS switch 7S1). The output terminal of inverter 7I3 is connected to node 7j, which leads to output Q. The output terminal of inverter 7I2 is connected to node 7i, which leads to inverted output QB. In this connection, the combination of inverter 7I2 and CMOS switch 7S1 can also be deemed as a clocked inverter controlled by the complementary clock signals G, Gbi having logic contrary to complementary clock signals for control Gbi, G supplied to clocked inverter 7I1. Supply voltage from the first power supply VDD is supplied to node 7a, and supply voltage VSS from the second power supply VSS is supplied to node 7b. VSS is usually 0V.

[The Configuration of the Data Latch Circuit According to the Fourth Embodiment of the Present Invention]

Figure 8:
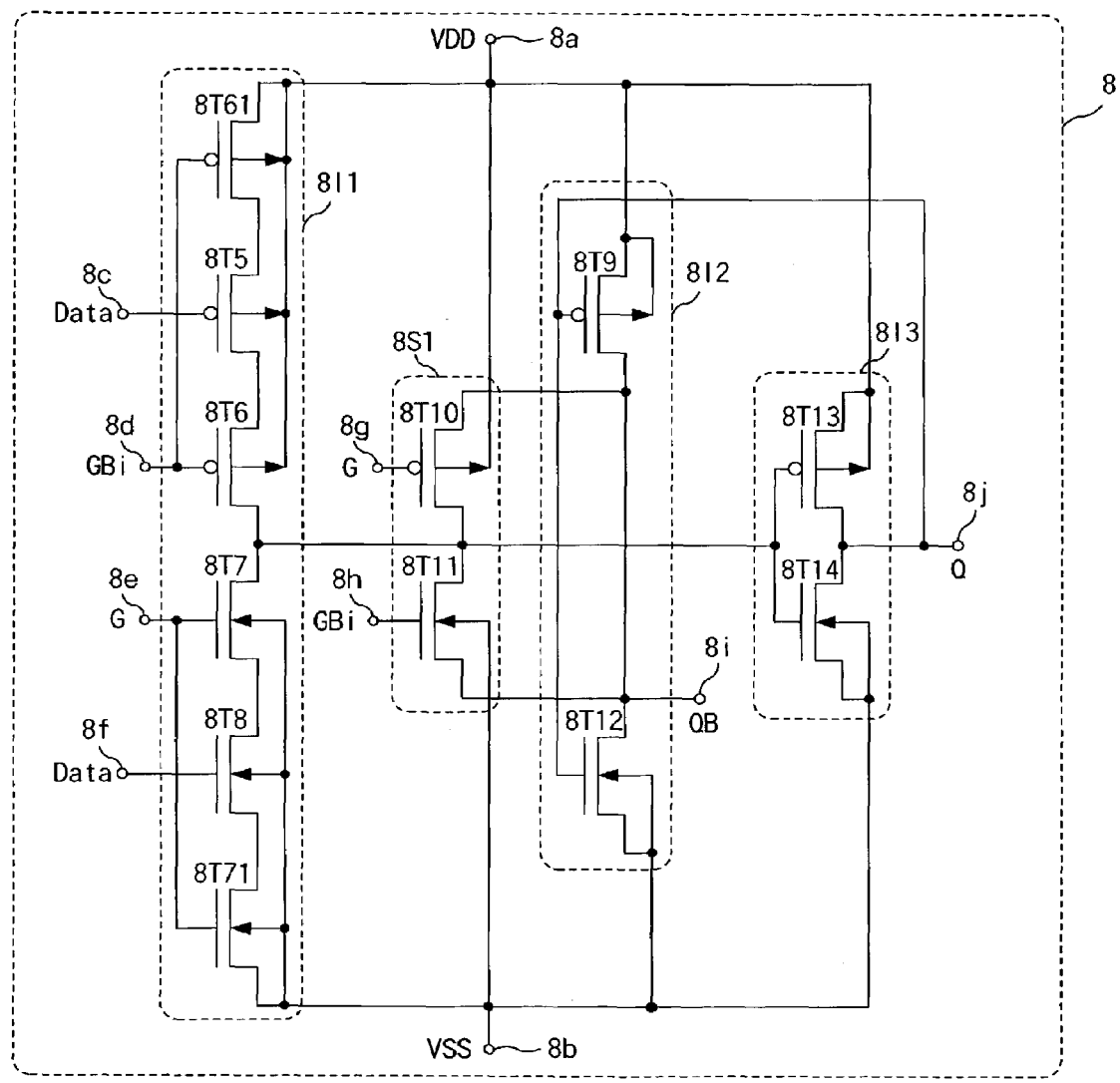
FIG. 8 is a circuit diagram showing the configuration of data latch circuit 8 comprising a transistor having a dual structure according to the fourth embodiment of the present invention.

FIG. 8 is a circuit diagram showing the configuration of data latch circuit 8 comprising a transistor having a dual structure according to the fourth embodiment of the present invention. Data latch circuit 8 has a structure as if clocked inverter 7I1 in data latch circuit 7 has been replaced with clocked inverter 8I1 comprising the duplicated transistor. Data latch circuit 8 has clocked inverter 8I1 comprising six transistors (8T5, 8T6, 8T61, 8T7, 8T71 and 8T8), and clocked inverter 8I1 has node 8c (connected to the gate of transistor 8T5) and node 8f (connected to the gate of transistor 8T8) to which input data signal Data is supplied, and node 8d (connected to the gates of transistors 8T6 and 8T61) and 8e (connected to the gates of transistors 8T7 and 8T71), to which complementary clock signals for control Gbi, G are supplied, respectively. Data latch circuit 8 has inverter 8I2 comprising transistors 8T9 and 8T12, inverter 8I3 comprising transistors 8T13 and 8T14, and CMOS switch 8S1 comprising transistors 8T10 and 8T11. The output of inverter 8I3 is connected directly to the input of inverter 8I2, and the output of inverter 8I2 is connected to the input of inverter 8I3 via CMOS switch 8S1, which is controlled by the complementary clock signals G, Gbi having logic contrary to complementary clock signals Gbi, G supplied to clocked inverter 8I1. With such connections, inverters 8I2 and 8I3 form a flip-flop (latch) by positive feedback loop. The output of clocked inverter 8I1 is connected to one input of flip-flop, namely the input of inverter 8I3 (and the output of inverter 8I2 via CMOS switch 8S1). The output terminal of inverter 8I3 is connected to node 8j, which leads to output Q. The output terminal of inverter 8I2 is connected to node 8i, which leads to inverted output QB. In this connection, the combination of inverter 8I2 and CMOS switch 8S1 can also be deemed as a clocked inverter controlled by the complementary clock signals G, Gbi having logic contrary to complementary clock signals for control Gbi, G supplied to clocked inverter 8I1. Supply voltage from the first power supply VDD is supplied to node 8a, and supply voltage VSS from the second power supply VSS is supplied to node 8b. VSS is usually 0V.

In inverter 8T1 of data latch circuit 8, (p-channel MOS) transistor 8T6, which corresponds to transistor 7T6 of inverter 7I1 in data latch circuit 7, is connected with transistor 8T61 having a channel of the same conductivity type in series with respect to the line of a source or drain via the source or drain line of transistor 8T5 to whose gate node 8c to which input data signal Data is supplied is connected, and their gates are connected to each other. Since these two transistors, 8T6 and 8T61, are connected to each other at their gates, and their lines of a source or drain controlled by the gates are connected in series to each other, they execute the same operation as they were single transistor as a whole. Here, for example, when transistors 8T6 and 8T61 are off status (such status that reveres clock signal Gbi is at a high level, namely clock signal G is at a low level, and clocked inverter 8I1 blocks input data signal Data because the clock signal is at a low level), and thus off status as a whole, even if either of these transistors becomes on status by malfunction due to the radiation of high energy particles, the off status can be retained as a whole since the other transistor is off. That is, even if such input data signal Data that makes transistor 8T5 on is supplied via node 8c, the "on" status of transistor 8T5 will be blocked by either of transistors 8T6 and 8T61 sandwiching transistor 8T5 which does not malfunction. Therefore, in data latch circuit 8, a redundant system is formed by providing a dual structure to the transistor controlled by the clock contained in clocked inverter 8I1 which is input step of input data signal Data, and thus, when clock signal G is at a low level, the transfer of input data signal Data to a downstream without intention due to the single event is prevented. As transistor 8T6 is connected in series with transistor 8T61, so transistor 8T7 is connected with transistor 8T71 in series with respect to the line of a source or drain, via the line of a source or drain of transistor 8T8 whose gate is connected to node 8f to which input data signal Data is supplied. Namely, each of transistors 8T6 and 8T7 in data latch circuit 8, which corresponds to transistors 7T6 and 7T7 in data latch circuit 7 respectively, constitutes a dual structure by being connected with transistor 8T61 or 8T71 in series with respect to the line of a source or drain via transistor 8T5 or 8T8 controlled by input data signal Data, and thus the malfunction will be prevented in the same manner.

[The Configuration of the Data Latch Circuit According to the Fifth Embodiment of the Present Invention]

Figure 9:
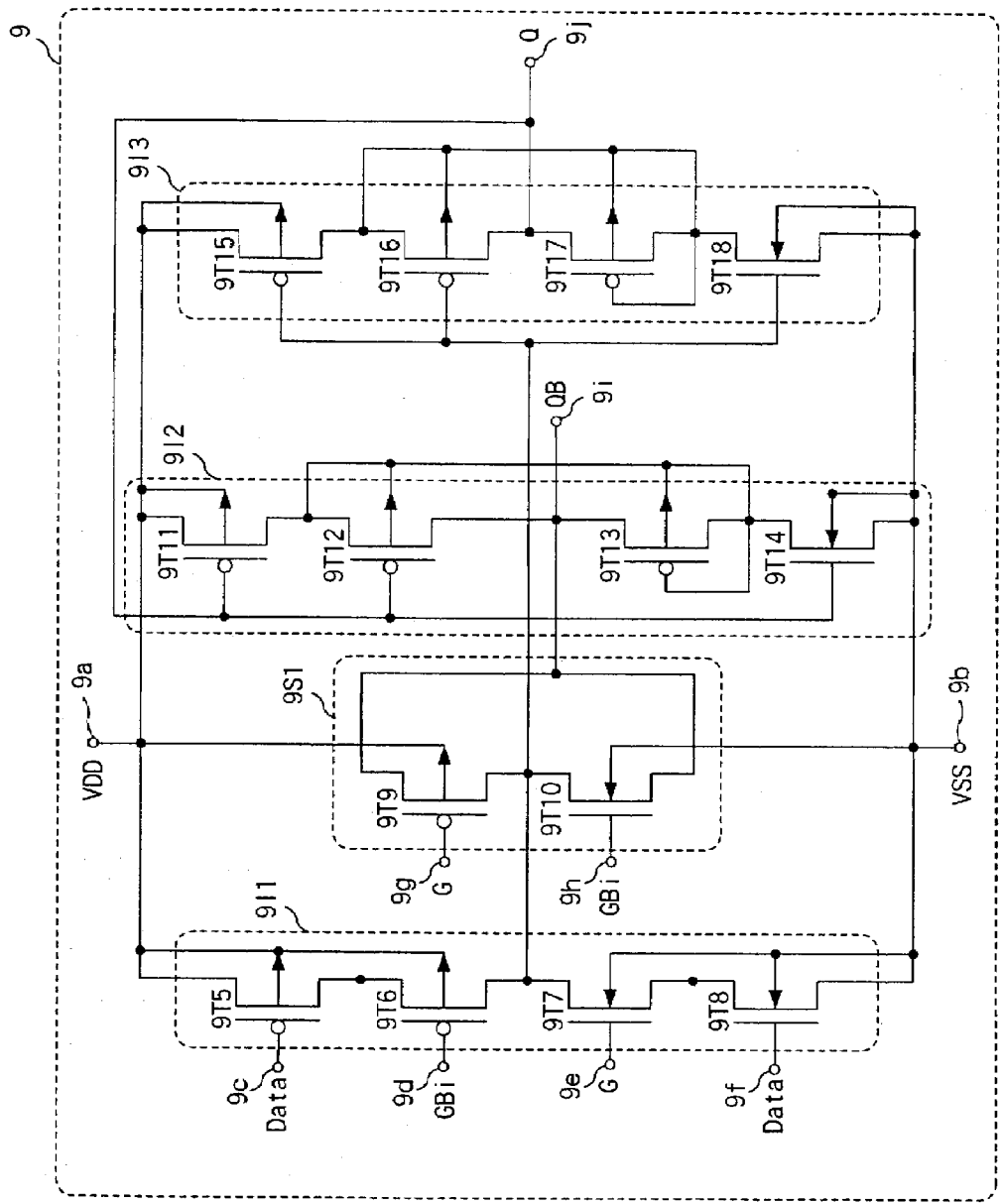
FIG. 9 is a circuit diagram showing the configuration of data latch circuit 9 comprising a transistor having a dual structure according to the fifth embodiment of the present invention.

FIG. 9 is a circuit diagram showing the configuration of data latch circuit 9 comprising a transistor having a dual structure according to the fifth embodiment of the present invention. Data latch circuit 9 has a structure as if each of inverters 7I2 and 7I3 in data latch circuit 7 has been replaced with inverters 8I2 and inverter 8I3, respectively. Inverters 8I2 and 8I3 are the inverters having the same dual structure as above-described inverter 3. Therefore, in data latch circuit 9, a redundant system is formed by providing transistor with a dual structure, and thus the change in the logical status without intention due to the single event is prevented. The output of inverter 9I3 having the dual structure is connected directly to the input of inverter 9I2, which also has a dual structure, and the output of inverter 9I2 is connected to the input of inverter 9I3 via CMOS switch 9S1, which is controlled by the complementary clock signals G, Gbi having logic contrary to complementary clock signals Gbi, G supplied to clocked inverter 9I1. With such connections, inverters 9I2 and 9I3 form a flip-flop (latch) by positive feedback loop. The output of clocked inverter 9I1 is connected to one input of flip-flop, namely the input of inverter 9I3 (and the output of inverter 9I2 via CMOS switch 9S1). The output terminal of inverter 9I3 is connected to node 9j, which leads to output Q. The output terminal of inverter 9I2 is connected to node 9i, which leads to inverted output QB. In this connection, the combination of inverter 9I2 and CMOS switch 9S1 can also be deemed as a clocked inverter controlled by the complementary clock signals G, Gbi having logic contrary to complementary clock signals for control Gbi, G supplied to clocked inverter 9I1. Supply voltage from the first power supply VDD is supplied to node 9a, and supply voltage VSS from the second power supply VSS is supplied to node 9b. VSS is usually 0V.

[The Configuration of the Data Latch Circuit According to the Sixth Embodiment of the Present Invention]

Figure 10:
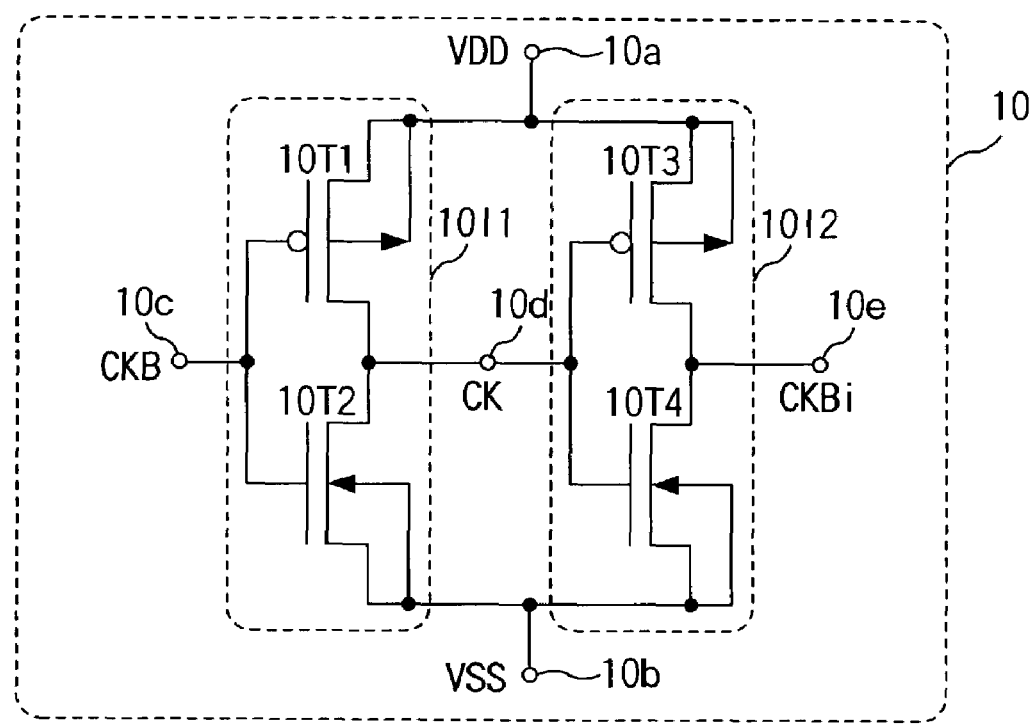
FIG. 10 is a circuit diagram showing the configuration of buffer circuit 10 which generates complementary clock and inverted clock signals having shaped waveform to be supplied to data latch circuit 11.

FIG. 10 is a circuit diagram showing a typical configuration of buffer circuit 10 which generates complementary clock and inverted clock signals having shaped rising and falling waveforms of the signal to be supplied to data latch circuit. Buffer circuit 10 has the configuration as buffer circuit 6, and only different signs, such as not GB but CKB for input inverted clock signal, not G but CK for the clock signal having shaped waveform, and not GBi but CKBi for the inverted clock signal having shaped waveform, are used.

Figure 11:
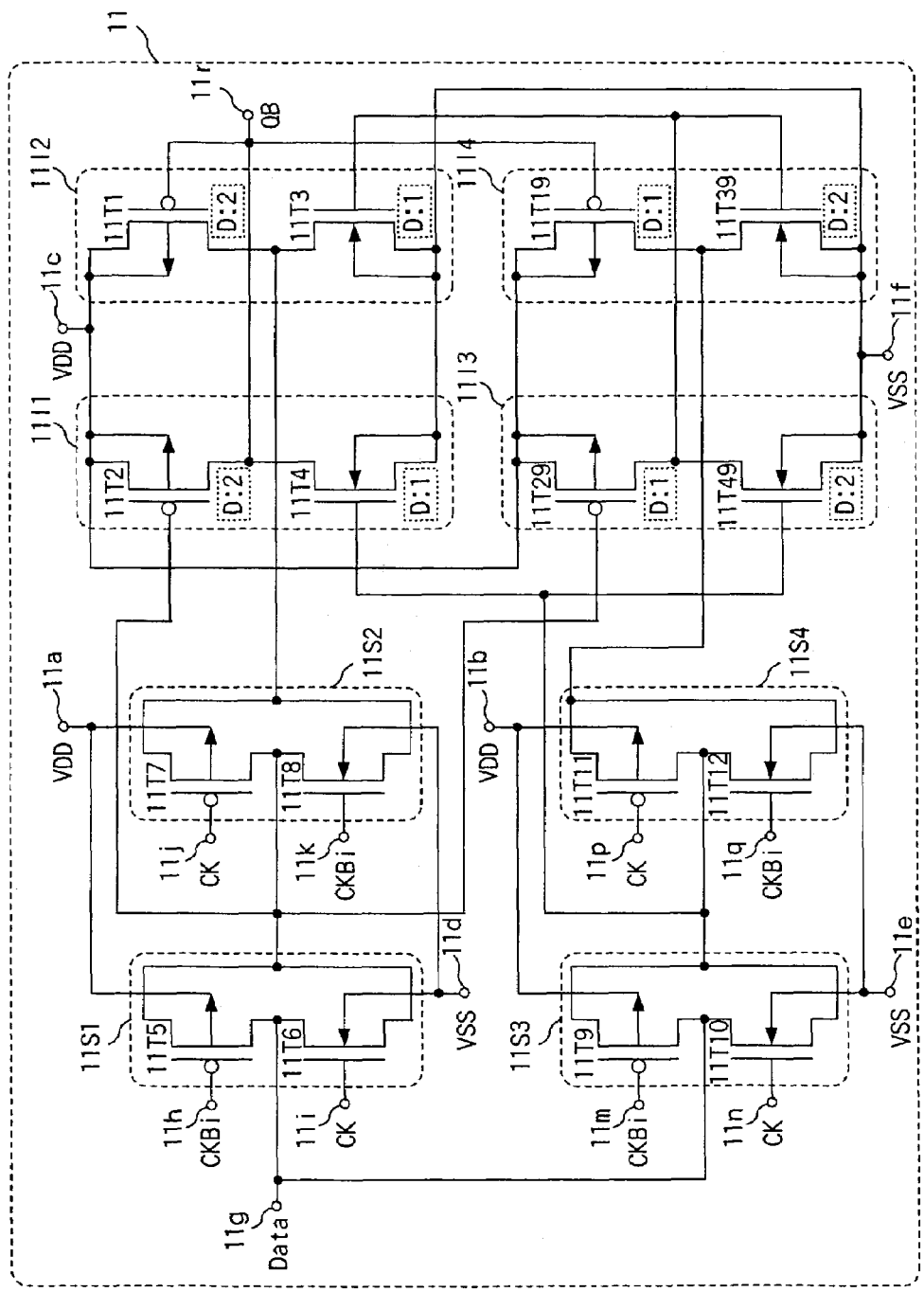
FIG. 11 is a circuit diagram showing the configuration of data latch circuit 11 comprising a transistor having a dual structure according to the sixth embodiment of the present invention.

FIG. 11 is a circuit diagram showing the configuration of data latch circuit 11 according to the sixth embodiment of the present invention. In general, data latch circuit 11 has such structure that the first data latch circuit comprising inverters 11I1 and 11I2 and CMOS switches 11S1 and 11S2 is connected with the second data latch circuit comprising inverters 11I3 and 11I4 and CMOS switches 11S3 and 11S4 each other. The first data latch circuit comprises the first inverter (11I1), the second inverter (11I2), the first CMOS switch (11S1) in which a data signal is connected to one terminal and said data signal is output from the other terminal to a downstream under the control of the clock signal for control, and the second CMOS switch (11S2) in which the output of said second inverter is connected to one terminal and the data signal input from said one terminal is output from the other terminal to a downstream under the control of the inverted logic signal of said clock signal.

The second data latch circuit comprises the third inverter (11I3), the fourth inverter (11I4), the third CMOS switch (11S3) in which said data signal is connected to one terminal and said data signal is output from the other terminal to a downstream under the control of said clock signal for control, and the fourth CMOS switch (11S4) in which the output of said fourth inverter is connected to one terminal and the data signal input from said one terminal is output from the other terminal to a downstream under the control of the inverted logic signal of said clock signal.

Each of the first, second, third and fourth inverters comprises a p-channel MOS transistor and an n-channel MOS transistor connected in series with respect to the line of a source or drain. The output of the first inverter is connected to the gate of the transistor having one conductivity type of the second inverter and to the gate of the transistor having that one conductivity type of the fourth inverter. The output of the third inverter is connected to the gate of the transistor having the other conductivity type of the second inverter and to the gate of the transistor having that other conductivity type of the fourth inverter. The output of the second inverter is connected, via the second CMOS switch, to the gate of the transistor having one conductivity type of the first inverter and to the gate of the transistor having that one conductivity type of the third inverter. The output of the fourth inverter is connected, via the fourth CMOS switch, to the gate of the transistor having the other conductivity type of the first inverter and to the gate of the transistor having that other conductivity type of the third inverter. Namely, the data latch circuit is wherein it has such structure that the output from the inverter constituting one flip-flop is connected to the gate of the transistor constituting the other inverter in the same flip-flop, and to the gate of the transistor having the same conductivity type and constituting the inverter corresponding to said other inverter in the other flip-flop. The output from the inverter constituting the other flip-flop is connected in the same manner, and thus the output from either of the inverters is connected so to speak complementarily to the gate of the transistor constituting the other inverter in the same flip-flop, and to the gate of the transistor having the same conductivity type of the inverter corresponding to said the other inverter in the other flip-flop.

The output from the other terminal of the first CMOS switch is connected to the output from the other terminal of the second CMOS switch, to the gate of the transistor having one conductivity type of the first inverter and to the gate of the transistor having one conductivity type of the third inverter. The output from the other terminal of the third CMOS switch is connected to the output from the other terminal of the fourth CMOS switch, to the gate of the transistor having other conductivity type of the first inverter and to the gate of the transistor having the other conductivity type of the third inverter. The output terminal of inverter 11I1 is connected to node 11r which leads to inverted output QB.

Here, preferably, the inverter of the first to fourth inverters comprises a p-channel MOS transistor and an n-channel MOS transistor, in which the drive performance of one MOS transistor is larger than the drive performance of the other MOS transistor, when the drive performance of the p-channel MOS transistor is larger than the drive performance of the n-channel transistor, the output of the inverter is connected, either directly or via an CMOS switch, to the gates of p-channel MOS transistors included in each of the inverters contained, between the combination of the first and the third inverters and the combination of the second and the fourth inverters, in the combination of the inverters which does not include that inverter; and when the drive performance of the n-channel MOS transistor is larger than the drive performance of the p-channel transistor, the output of the inverter is connected, either directly or via an CMOS switch, to the gates of n-channel MOS transistors included in each of the inverters contained, between the combination of the first and the third inverters and the combination of the second and the fourth inverters, in the combination of the inverters which does not include that inverter. In this example, the drive performance is represented by ratio as 11T1:11T3=2:1, 11T2:11T4=2:1, 11T39:11T19=2:1, and 11T49:11T29=2:1. In FIG. 11, the indications "D:x" surrounded dashed line just below the symbols of transistors of flip-flop represent that the relative size of the drive performance is "x."

As such, by using transistors having different drive performances, the output from an inverter is regulated by the transistor having larger drive performance, even if one of the transistors constituting the inverter malfunctions from off to on, and thus both of the transistors becomes on. Here, when the drive performance of the p-MOS transistor in the inverter is larger (11T1 and 11T2 here), even if the transistor malfunctions, since a low level output will not output in error, when such output of the inverter is (for both the first flip-flop circuit and the second flip-flop circuit) connected with the gate of the p-MOS transistor of the other inverter, those p-MOS transistor will not malfunction to become on. Similarly, when the drive performance of the nMOS transistor in the inverter is larger (11T39 and 11T49 here), even if the transistor malfunctions, since a high level output will not output in error, when such output of the inverter is (for both the first flip-flop circuit and the second flip-flop circuit) connected with the gate of the n-MOS transistor of the other inverter, those n-MOS transistor will not malfunction to become on. Therefore, the outputs of the inverters and the gates of the transistors are connected as such.

[The Operation of the Data Latch Circuit According to an Embodiment of the Present Invention]

The operation of the data latch circuit will be illustrated next. FIG. 19 is a timing diagram illustrating the operation of data latch circuits 7 and 8. FIG. 20 is a timing diagram illustrating the operation of data latch circuit 9. FIG. 21 is a timing diagram illustrating the operation of data latch circuit 11. In this connection, since the important thing for illustrating the present invention is not the transient characteristics of the voltage change but the transition of the logical status, only the change in the logical status (high level, low level) is shown in FIGS. 19 to 21. In FIGS. 19 to 21, input inverted clock signal GB corresponds to node 6c, input data signal Data corresponds to nodes 7c, 7f, 8c, 8f, 9c, 9f and 11g, output Q corresponds to nodes 7j, 8j and 9j, inverted output QB corresponds to nodes 7i, 8i, 9i and 11r, clock signal G corresponds to nodes 6d, 7g, 8g and 9g, inverted clock signal GBi corresponds to nodes 6e, 7d, 7h, 8d, 8h, 9d and 9h, input inverted clock signal CKB corresponds to node 10c, clock signal CK corresponds to nodes 10d and 11i, 11j, 11n and 11p, inverted clock signal CKBi corresponds to nodes 10e, 11h, 11k, 11m and 11q, respectively. Each Tx corresponds to corresponding transistor yTx in data latch circuit y. In this connection, the logical status of Tx is illustrated by corresponding the off status of the transistor to the low level and the on status to the high level.

[Data Latch Circuits 7 and 8—Status S71/S81—Normal Operation]

By referring FIG. 19, and by shifting the status of data latch circuits 7 and 8 (and buffer circuit 6) to status S71 to S77 and S81 to S87, respectively, the operation of data latch circuits 7 and 8 in each of the status will be illustrated. First, in status S71, input inverted clock signal GB is at a low level, and it is supplied to buffer circuit 6. By the function of the inverter, buffer circuit 6 outputs clock signal G of a high level and inverted clock signal GBi of a low level. The waveform of the signal output from buffer circuit 6 is shaped by the signal amplification function of the inverter, and thus the operations of data latch circuits 7 and 8, which are cascade-connected in a downstream, are assured. The complementary clock signal G (high level) and inverted clock signal GBi (low level) output from buffer circuit 6 is input to the gate of (n-channel MOS) transistor 7T7 via node 7e and the gate of (p-channel MOS) transistor 7T6 via node 7d in data latch circuit 7, and is input to the gates of (n-channel MOS) transistors 8T7 and 8T71 via node 8e and the gates of (p-channel MOS) transistors 8T6 and 8T61 via node 8d in data latch circuit 8, and thus turns these transistors on. As a result, each of clocked inverters 7I1 and 8I1 operates as an inverter under the control of the clock, and outputs inverted output corresponding to input data signal Data to a downstream. Since input data signal Data is at a high level, inverters 7I1 and 8I1 output a low level to a downstream. Inverters 7I3 and 8I3 in a downstream, to which that signal of a low level is input, output a high level, and then it is output to output Q via nodes 7j and 8j, and is input to inverters 7I2 and 8I2. Inverters 7I2 and 8I2, to which the signal of a high level has been input, output a low level to inverted output QB via nodes 7i and 8i. In CMOS switches 7S1 and 8S1 connected between the outputs of inverters 7I2 and 8I2 and the inputs of inverters 7I3 and 8I3, the complementary inverted clock signal GBi and clock signal G having logic contrary to complementary clock signal G and inverted clock signal GBi, which are supplied to clocked inverters 7I1 and 8I1, are input to geometrically corresponding nodes. Namely, the complementary inverted clock signal GBi (low level) and clock signal G (high level)

is input to the gate of (n-channel MOS) transistor 7T11 via node 7h and the gate of (p-channel MOS) transistor 7T10 via node 7g in data latch circuit 7, and is input to the gate of (n-channel MOS) transistors 8T11 via node 8h and the gate of (p-channel MOS) transistor 8T10 via node 8g in data latch circuit 8, and thus turns these transistors off As a result, either of inverters 7I2 and 8I2 does not output inverted output corresponding to the input to a downstream, and thus the output becomes the status of high impedance. Each of the outputs of inverters 7I2 and 8I2, together with the outputs of clocked inverters 7I1 and 8I1, respectively, is connected to the each of the inputs of inverters 7I3 and 8I3 via CMOS switch 7S1 or 8S1, respectively. However, in this status S71/S81, since the signals to the inputs of inverters 7I3 and 8I3 are blocked, inverters 7I2 and 8I2 do not contribute to retain the logical status of the flip-flop. The logical status of the flip-flop is defined based on the output of inverted logic of input data signal Data from clocked inverters 7I1 and 8I1, which operate as inverters. Here, since input data signal Data is at a high level, output Q becomes a high level, and inverted output QB becomes a low level. In this connection, since the output of the data latch circuit is regulated by input data signal Data in this situation, this status is called a "transparent mode."

[Data Latch Circuits 7 and 8—Status S71/S81—Single Event]

Here, the possibility of the occurrence of single event on data latch circuits 7 and 8 in status S71/S81 will be examined. Since the data latch circuit is in the transparent mode, even if any of the transistors malfunctions instantly due to the irradiation by high energy particles, single event will not be readily manifested because the output is eventually defined by input data signal Data. It may be noted, however, that if the transistor which malfunctions is the transistor to whose gate input data signal Data is input, logical value which does not fit to the logical value of input data signal Data may be output momentarily.

[Data Latch Circuits 7 and 8—Status S72/82—Normal Operation]

Next, with input data signal Data kept at a high level, input inverted clock signal GB is changed from a low level to a high level (status S72/S82). Buffer circuit 6, to which input inverted signal GB of a high level is input, outputs clock signal G of a low level and clock signal GBi of a high level to the input side of inverters 7I1 and 8I1. As a result, transistors 7T6, 7T7, 8T6, 8T61, 8T7, and 8T71 become off, and either of clocked inverters 7I1 and 8I1 will not work as an inverter under the control of the clock signal. Namely, at the point of the fall of clock signal G, the inverted output (low level) corresponding to input data signal Data (high level) stops being output to a downstream, and the output becomes the status of high impedance. In CMOS switches 7S1 and 8S1, the complementary inverted clock signal GBi (high level) and clock signal G (low level) having logic contrary to complementary clock signal G and inverted clock signal GBi, which are supplied to clocked inverters 7I1 and 8I1, are input to geometrically corresponding nodes. As a result, transistors 7T10, 7T11, 8T10, and 8T11 become on, and the inverted outputs (low level) of the inputs of inverters 7I2 and 8I2 are output from COMS switches 7S1 and 8S1. This inverted output (low level) is input to clocked inverters 7I3 and 8I3 instead of the outputs from clocked inverters 7I1 and 8I1, which are not working as an inverter and whose outputs have been changed into the status of high impedance, and maintains the logical status of the flip-flop as the same logical status as it was at the moment (at the fall of clock signal G) when the status shifted from S71 to S72 or S81 to S82. Namely, output Q is at a high level, and output QB is at a low level.

[Data Latch Circuits 7 and 8—Status S72/S82—Single Event]

Here, the possibility of the occurrence of single event on data latch circuits 7 and 8 in status S72/S82 will be examined. Data latch circuits 7 and 8 have the logical status of flip-flop which fits input data signal Data. Therefore, even if the transistor (off) in inverter 7I1 or 8I1, to which clock signal G or inverted clock signal GBi is input, malfunctions and becomes on due to the irradiation by high energy particles, the logical status of the flip-flop and thus outputs Q and QB will not change. Therefore, in this case, for both of the data latch circuits 7 and 8, single event at the input step of the input data signal will not be readily manifested. However, for both of the data latch circuits 7 and 8, if the transistor of off status in inverters 7I2, 7I3, 8I2 or 8I3 malfunctions and becomes on, there is a possibility that the output of that inverter is inverted thereby, and the output of the other inverter is also inverted, and thus the logical status of the flip-flop is inverted. Therefore, in this case, the flip-flop is subject to the occurrence of single event.

[Data Latch Circuits 7 and 8—Status S73/83—Normal Operation]

Next, with input inverted clock signal GB kept at a high level, input data signal Data is changed from a high level to a low level (status S73/S83). Buffer circuit 6, to which input inverted signal GB of a high level is input, remains outputting clock signal G of a low level and clock signal GBi of a high level to the input side of clocked inverters 7I1 and 8I1, and either of clocked inverters 7I1 and 8I1 will not still work as an inverter. As a result, the change in input data signal Data is not transferred to a downstream. Therefore, the logical status of the flip-flop will not change. Namely, output Q remains a high level, and output QB remains a low level. Thus, when input inverted clock signal GB is at a high level, regardless of the change in input data signal Data, the logical status of the flip-flop is retained, and the output keeps its prior status.

[Data Latch Circuit 7—Status S73—Single Event]

Here, the possibility of the occurrence of single event on data latch circuit 7 in status S73 will be examined. Data latch circuit 7 has the logical status of flip-flop and the logical values of output Q (high level) and output QB (low level), which do not fit input data signal Data (low level). Therefore, if the transistor 7T6 (off) in inverter 7I1 malfunctions and becomes on due to the irradiation by high energy particles, the inverted output (high level) of input data signal Data (low level) is output from inverter 7I1, and invert the logical status of the flip-flop in a downstream. Namely, the output from inverter 7I3 and output Q are inverted from a high level to a low level, and the output from inverter 7I2 and output QB are inverted from a low level to a high level, respectively. As such, the clocked inverter at the first step captures input data signal Data even when there is no clock signal for letting it work as an inverter, and create malfunction by inverting each of outputs Q and QB as a result. This is a single event at the input step of input data signal Data, and data latch circuit 7 is subject to the occurrence of this phenomenon. In addition, similar to status S72, data latch circuit 7 is subject to the occurrence of single event at the flip-flop.

[Data Latch Circuit 8—Status S83—Single Event]

Next, the possibility of the occurrence of single event on data latch circuit 8 in status S83 will be examined. Data latch circuit 8 has the logical status of flip-flop and the logical values of output Q (high level) and output QB (low level), which do not fit input data signal Data (low level). For example, suppose the transistor 8T6 (off) in inverter 8I1 malfunctions and becomes on due to the irradiation by high energy particles. Here, transistor 8T6 is connected with transistor 8T61 having a channel of the same conductivity type in series with respect to the line of a source or drain via the source or drain line of transistor 8T5, which is turned on by input data signal Data (low level), and their gates are connected to each other, and transistor 8T61 remains off. Therefore, the change in the level due to the malfunction of transistor 8T6 is blocked by transistor 8T61 which remains off, and the off status is retained as a whole. As a result, even if transistor 8T6 becomes on instantly, the effect resulted will stay inside transistor 8T6 itself, and thus transistors 8T6 and 8T61 as a whole, inverter 8I1, and the flip-flop in a downstream will not be affected. Even if any one of the transistors in the clocked inverter at the first step malfunctions as described above, the result of the malfunction will be blocked by the transistor, which constitutes a dual structure by being connected with that transistor in series with respect to the line of a source or drain via a transistor controlled by input data signal Data. Thus, the occurrence of single event at the input step of the input data signal will be prevented. However, similar to the status S82, data latch circuit 8 is subject to the occurrence of single event in the flip-flop.

[Data Latch Circuits 7 and 8—Status S74/84—Normal Operation]

Next, with input data signal Data kept at a low level, input inverted clock signal GB is changed from a high level to a low level (status S74/S84). Buffer circuit 6, to which input inverted signal GB of a low level is input, outputs clock signal G of a high level and clock signal GBi of a low level to the input side of inverters 7I1 and 8I1. As a result, transistors 7T6, 7T7, 8T6, 8T61, 8T7, and 8T71 become one, and both of clocked inverters 7I1 and 8I1 will work as an inverter under the control of the clock signal. This status S74/S84, as well as the above-described status S71/S81, is the transparent mode, and will be regulated by input data signal Data (low level). Therefore, all of the logical status of flip-flop and the logical values of output Q and output QB, which did not fit input data signal Data in the previous status S73/S83, change to those fit the logical value of input data signal Data. Namely, the logical status of the flip-flop is inverted, and output Q changes from a high level to a low level, and output QB changes a low level to a high level.

[Data Latch Circuits 7 and 8—Status S74/S84—Single Event]

Here, for the possibility of the occurrence of single event on data latch circuits 7 and 8 in status S74/S84, similar to the case of status S71/S81, since the data latch circuit is in the transparent mode, the output is eventually defined by input data signal Data. Therefore, for both data latch circuits 7 and 8, single event will not be readily manifested. It may be noted, however, that if the transistor which malfunctions is the transistor to whose gate input data signal Data is input, logical value which does not fit to the logical value of input data signal Data may be output momentarily.

[Data Latch Circuits 7 and 8—Status S75 to S77/85 to S87]

Turning input data signal Data to a high level (status S75/S85) with data latch circuits 7 and 8 kept at the transparent mode (input inverted clock signal GB is at a low level), output Q becomes a high level and inverted output QB becomes a low level. Similarly, turning input data signal Data to a low level (status S76/S86) with it kept at the transparent mode, output Q becomes a low level and inverted output QB becomes a high level. In these transparent modes, similar to the cases in statuses S71/S81 and S74/S84, single event will not be readily manifested. Next, canceling the transparent mode (input inverted clock signal GB is at a high level) (status S77/S87), output Q of a high level and inverted output QB of a low level, which correspond to input data signal Data having a low level at the moment of the cancellation, are retained. In this status, for data latch circuit 7 is subject to the occurrence of single event phenomenon at the input step of the input data signal similar to the above-described statuses S72/S82 and S73/S83, but as for data latch circuit 8 comprising a transistor having a dual structure, single event phenomenon at the input step of the input data signal is prevented. However, data latch circuits 7 and 8 are subject to the occurrence of single event in the flip-flop.

[Data Latch Circuit 9—Status S91—Normal Operation]

By referring FIG. 20, and by shifting the status of data latch circuit 9 (and buffer circuit 6) to status S91 to S97, respectively, the operation of data latch circuit 9 in each of the statuses will be illustrated. First, in status S91, input inverted clock signal GB is at a low level, and it is supplied to buffer circuit 6. By the function of the inverter, buffer circuit 6 outputs clock signal G of a high level and inverted clock signal GBi of a low level having shaped waveforms. By these clocks, clocked inverter 9I1 operates as an inverter, and outputs inverted output corresponding to input data signal Data to a downstream. Since input data signal Data is at a high level, inverter 9I1 outputs a low level to a downstream. Inverter 9I3 in a downstream, to which that signal of a low level is input, outputs a high level, and then it is output to output Q via node 9j, and is input to clocked inverter 9I2. Inverter 9I2, to which the signal of a high level has been input, outputs a low level to inverted output QB via node 9i. In CMOS switch 9S1 connected between the output of inverter 9I2 and the input of inverter 9I3, the complementary inverted clock signal GBi and clock signal G having logic contrary to complementary clock signal G and inverted clock signal GBi, which are supplied to clocked inverter 9I1, are input to geometrically corresponding node. Namely, the complementary inverted clock signal GBi (low level) and clock signal G (high level) are input to the gate of (n-channel MOS) transistor 9T10 via node 9h and the gate of (p-channel MOS) transistor 9T9 via node 9g, respectively, and thus turns these transistors off. Thus, CMOS switch 9S1 becomes off As a result, inverter 9I2 does not output inverted output corresponding to the input to a downstream, and thus the output becomes the status of high impedance. This status is a transparent mode, and since input data signal Data is at a high level, output Q becomes a high level, and inverted output QB becomes a low level.

[Data Latch Circuit 9—Status S91—Single Event]

Here, the possibility of the occurrence of single event on data latch circuit 9 in status S91 will be examined. Since the data latch circuit is in the transparent mode, even if any of the transistors malfunctions instantly due to the irradiation by high energy particles, the output is eventually defined by input data signal Data. Therefore, single event will not be readily manifested. It may be noted, however, that if the transistor which malfunctions is the transistor to whose gate input data signal Data is input, logical value which does not fit to the logical value of input data signal Data may be output momentarily.

[Data Latch Circuit 9—Status S92—Normal Operation]

Next, with input data signal Data kept at a high level, input inverted clock signal GB is changed from a low level to a high level (status S92). Buffer circuit 6, to which input inverted signal GB of a high level is input, outputs clock signal G of a low level and clock signal GBi of a high level to the input side of inverter 9I1. As a result, clocked inverter 9I1 will not work as an inverter under the control of the clock signal. Namely, at the point of the fall of clock signal G, the inverted output (low level) corresponding to input data signal Data (high level) stops being output to a downstream, and the output becomes the status of high impedance. In CMOS switch 9S1, the complementary inverted clock signal GBi (high level) and clock signal G (low level) having logic contrary to complementary clock signal G and inverted clock signal GBi, which are supplied to clocked inverter 9I1, are input to geometrically corresponding nodes. As a result, the inverted outputs (low level) of the input of inverter 9I2 is output from COMS switch 9S1. This inverted output (low level) is input to clocked inverter 9I3 instead of the output from clocked inverter 9I1, which is not working as an inverter and whose output has been changed into the status of high impedance, and maintains the logical status of the flip-flop as the same logical status as it was at the moment (at the fall of clock signal G) when the status shifted from S91 to S92. Namely, output Q is at a high level, and output QB is at a low level.

[Data Latch Circuit 9—Status S92—Single Event]

Here, the possibility of the occurrence of single event on data latch circuit 9 in status S92 will be examined. Suppose one of the transistors in "off" status in inverter 9I1, malfunctions and becomes "on." Here, since the result of the malfunction will be blocked by the transistor constituting a dual structure, the output of the inverter is inverted, and thus the reversion of the logical status of the flip-flop is prevented. Therefore, in this case, the occurrence of single event in the flip-flop will be prevented.

[Data Latch Circuit 9—Status S93—Normal Operation]

Next, with input inverted clock signal GB kept at a high level, input data signal Data is changed from a high level to a low level (status S93). Buffer circuit 6, to which input inverted signal GB of a high level is input, remains outputting clock signal G of a low level and clock signal GBi of a high level to the input side of clocked inverter 9I1, and clocked inverter 9I1 will not still work as an inverter. As a result, the change in input data signal Data is not transferred to a downstream. Therefore, the logical status of the flip-flop will not change. Namely, output Q remains a high level, and output QB remains a low level. Thus, when input inverted clock signal GB is at a high level, regardless of the change in input data signal Data, the logical status of the flip-flop is retained, and the output keeps its prior status.

[Data Latch Circuit 9—Status S93—Single Event]

Here, the possibility of the occurrence of single event on data latch circuit 9 in status S93 will be examined. Similar to the case of the above-described status S92, even if one of the transistors in "off" status contained in inverter 9I2 or 9I3 malfunctions and becomes "on," since that malfunction will be blocked by the transistor constituting the dual structure, the output of the inverter is inverted, and thus the reversion of the logical status of the flip-flop is prevented. Therefore, in this case, the occurrence of single event in the flip-flop will be prevented. In this connection, however, data latch circuit 9 has the logical status of flip-flop and the logical values of output Q (high level) and output QB (low level), which do not fit input data signal Data (low level). Therefore, if the transistor 9T6 (off) in inverter 9I1 as an input step of the input data signal malfunctions and becomes on due to the irradiation by high energy particles, the inverted output (high level) of input data signal Data (low level) is output from inverter 9I1, and invert the logical status of the flip-flop in a downstream. As such, data latch circuit 9 is subject to the occurrence of single event at the input step of input data signal Data.

[Data Latch Circuit 9—Status S94—Normal Operation]

Next, with input data signal Data kept at a low level, input inverted clock signal GB is changed from a high level to a low level (status S94). Buffer circuit 6, to which input inverted signal GB of a low level is input, outputs clock signal G of a high level and clock signal GBi of a low level to the input side of inverter 9I1. As a result, clocked inverter 9I1 will work as an inverter under the control of the clock signal. This status S94, as well as the above-described status S91, is the transparent mode, and will be regulated by input data signal Data (low level). Therefore, all of the logical status of flip-flop and the logical values of output Q and output QB, which did not fit input data signal Data in the previous status S93, change to those fit the logical value of input data signal Data. Namely, the logical status of the flip-flop is inverted, and output Q changes from a high level to a low level, and output QB changes a low level to a high level.

[Data Latch Circuit 9—Status S94—Single Event]

Here, for the possibility of the occurrence of single event on data latch circuit 9 in status S94, similar to the case of status S91, since the data latch circuit is in the transparent mode, the output is eventually defined by input data signal Data. Therefore, single event will not be readily manifested. It may be noted, however, that if the transistor which malfunctions is the transistor to whose gate input data signal Data is input, logical value which does not fit to the logical value of input data signal Data may be output momentarily.

[Data Latch Circuit 9—Status S95 to S97]

Turning input data signal Data to a high level (status S95) with data latch circuit 9 kept at the transparent mode (input inverted clock signal GB is at a low level), output Q becomes a high level and inverted output QB becomes a low level. Similarly, turning input data signal Data to a low level (status S96) with kept it at the transparent mode, output Q becomes a low level and inverted output QB becomes a high level. In these transparent modes, similar to the cases in statuses S91 and S94, single event will not be readily manifested. Next, canceling the transparent mode (input inverted clock signal GB is at a high level) (status S97), output Q of a high level and inverted output QB of a low level, which correspond to input data signal Data having a low level at the moment of the cancellation, are retained. In this status, because of the transistor having a dual structure, single event phenomenon in the flip-flop is prevented. However, data latch circuit 9 is subject to the occurrence of single event at the input step of the input data signal.

[Data Latch Circuit 11—Status S11—Normal Operation]

By referring FIG. 21, and by shifting the status of data latch circuit 11 (and buffer circuit 10) to status S111 to S118, respectively, the operation of data latch circuit 11 in each of the statuses will be illustrated. First, in status S11, input inverted clock signal CKB is at a low level, and it is supplied to buffer circuit 10. By the function of the inverter, buffer circuit 10 outputs clock signal CK of a high level and inverted clock signal CKBi of a low level having shaped waveforms. By these clocks, CMOS switches 11S1 and 11S2 become on, and each of them outputs input data signal Data of a high level to a downstream. To the downstream of COMS switch 11S1, CMOS switch 11S2 which is turned off by the clock, the gate of transistor 11T2 of inverter 11I1, and the gate of transistor 11T29 of inverter 11I3 are connected. By the input of a high level, transistors 11T2 and 11T29 become off. To the downstream of COMS switch 11S3, CMOS switch 11S4 which is turned off by the clock, the gate of transistor 11T4 of inverter 11I1, and the gate of transistor 11T49 of inverter 11I3 are connected. By the input of a high level, transistors 11T4 and 11T49 become on. Therefore, inverters 11I1 and 11I3, to each of which a high level is input, invert it to a low level and output it to a downstream. The low level output from inverter 11I1 is output to node 11*r* leading to inverted output QB. In addition, the low level output from inverter 11I1 is supplied to transistor 11T1 of inverter 11I2 and transistor 11T19 of inverter 11I4. The low level output from inverter 11I3 is supplied to transistor 11T3 of inverter 11I2 and transistor 11T39 of inverter 11I4. Thus, inverters 11I2 and 11I4, to each of which a low level is input, invert it to a high level and output it to a downstream. Namely, the high level output from inverter 11I2 is supplied to one end of COMS switch 11S2 which is off, and the high level output from inverter 11I4 is supplied to one end of COMS switch 11S4 which is off. This status S111 is a transparent mode, and inverted output QB regulated by input data signal Data, namely a low level, is output.

[Data Latch Circuit 11—Status S111—Single Event]

Here, the possibility of the occurrence of single event on data latch circuit 11 in status S111 will be examined. Since data latch circuit 11 is in the transparent mode, even if any of the transistors malfunctions instantly due to the irradiation by high energy particles, the output is eventually defined by input data signal Data. Therefore, in data latch circuit 11, single event will not be readily manifested. It may be noted, however, that if the transistor which malfunctions is the transistor to whose gate input data signal Data is input, logical value which does not fit to the logical value of input data signal Data may be output momentarily.

[Data Latch Circuit 11—Status S112—Normal Operation]

Next, with input inverted clock signal CKB kept at a low level, input data signal Data is changed from a high level to a low level (status S112). This status S112, as well as the above-described status S11, is transparent mode, and the output will be regulated by input data signal Data (low level). Therefore, the logical status of the flip-flop is inverted, and the logical value of inverted output QB changes to a high level, which corresponds to the logical value of input data signal Data having a low level.

[Data Latch Circuit 11—Status S112—Single Event]

Here, the possibility of the occurrence of single event on data latch circuit 11 in status S112 will be examined. Similar to the case of status S111, since the data latch circuit 11 is in the transparent mode, single event will not be readily manifested. It may be noted, however, that if the transistor which malfunctions is the transistor to whose gate input data signal Data is input, logical value which does not fit to the logical value of input data signal Data may be output momentarily.

[Data Latch Circuit 11—Status S113—Normal Operation]

Next, with input data signal Data kept at a low level, input inverted clock signal CKB is changed from a low level to a high level (status S113). By these clocks, CMOS switches 11S1 and 11S3 become off, and input data signal Data stops being output to a downstream. On the other hand, CMOS switches 11S2 and 11S4 become on. As a result, the output having a low level from inverter 11I2, instead of input data signal Data having the same low level, is supplied to the gate of transistor 11T2 in inverter 11I1 and the gate of transistor 11T29 in inverter 11I3 via CMOS switch 11S2 which is on, and the output having a low level from inverter 11I4, instead of input data signal Data having the same low level, is supplied to the gate of transistor 11T4 in inverter 11I1 and the gate of transistor 11T49 in inverter 11I3 via CMOS switch 11S4 which is on. Thus, inverters 11I1 and 11I3, to which the low level is input, output a high level to inverters 11I2 and 11I4, and retain the same logical status of the flip-flop. Therefore, the flip-flop retains the same logical status as it was at the moment when input inverted clock signal CKB became a high level, and inverted output QB remains a low level.

[Data Latch Circuit 11—Status S113—Single Event]

Here, the possibility of the occurrence of single event on data latch circuit 11 in status S113 will be examined. First, the single event at the flip-flop is examined. For inverter 11I1, transistor 11T2 is on, transistor 11T4 is off, and the output of inverter 11I1 is at a high level. Suppose transistor 11T4 is irradiated by high energy particles, and becomes on. Despite the irradiation, since the drive performance of transistor 11T2 is twice as much as that of transistor 11T4, it retains the high level side. The situation is similar for inverter 11I3. Thus, the single event phenomenon is prevented. However, data latch circuit 11 is subject to the occurrence of single event phenomenon at the input step of the input data signal.

[Data Latch Circuit 11—Status S114—Normal Operation]

Next, with input data signal Data kept at a low level, input inverted clock signal CKB is changed from a high level to a low level (status S114). By these clocks, CMOS switches 11S1 and 11S3 become on, and input data signal Data starts being output to a downstream. On the other hand, CMOS switches 11S2 and 11S4 become off. As a result, the output having a low level, instead of the outputs having the same low level from inverters 11I2 and 11I4, is supplied to the gate of transistor 11T2 in inverter 11I1 and the gate of transistor 11T29 in inverter 11I3. Thus, the flip-flop retains the same logical status. This status S114 is a transparent mode.

[Data Latch Circuit 11—Status S114—Single Event]

Here, the possibility of the occurrence of single event on data latch circuit 11 in status S114 will be examined. Similar to the case of status S111, since the data latch circuit 11 is in the transparent mode, single event will not be readily manifested. It may be noted, however, that if the transistor which malfunctions is the transistor to whose gate input data signal Data is input, logical value which does not fit to the logical value of input data signal Data may be output momentarily.

[Data Latch Circuit 11—Status S115 to S116]

Next, with input inverted signal CKB kept at a low level, input data signal Data is changed from a low level to a high level (status S115). Since this is the transparent mode, inverted output QB of a low level corresponding to input data signal Data of a high level is output.

Next, with input inverted signal CKB kept at a low level, input data signal Data is changed from a high level to a low level (status S116). Since this is the transparent mode, inverted output QB of a high level corresponding to input data signal Data of a low level is output.

[Data Latch Circuit 11—Status S115 to S116—Single Event]

Here, the possibility of the occurrence of single event on data latch circuit 11 in status S115 to S116 will be examined. Similar to the case of status S111, since the data latch circuit 11 is in the transparent mode, single event will not be readily manifested. It may be noted, however, that if the transistor which malfunctions is the transistor to whose gate input data signal Data is input, logical value which does not fit to the logical value of input data signal Data may be output momentarily.

[Data Latch Circuit 11—Status S117—Normal Operation]

Next, with input data signal Data kept at a low level, input inverted signal CKB is changed from a low level to a high level (status S117). The mode shifts from the transparent mode to the retention mode. As a result, the situation in status S116 is retained, and inverted output QB of a high level corresponding to input data signal Data of a low level is output.

[Data Latch Circuit 11—Status S117—Single Event]

Here, the possibility of the occurrence of single event on data latch circuit 11 in status S117 will be examined. Similar to the case of status S113, since the data latch circuit 11 is in the retention mode, the single event phenomenon at the flip-flop is prevented. However, data latch circuit 11 is subject to the occurrence of single event phenomenon at the input step of the input data signal.

[Data Latch Circuit 11—Status S118]

Next, with input inverted signal CKB kept at a high level, input data signal Data is changed from a low level to a high level (status S118). Since this is still the retention mode, even when input data signal Data changes, the change will be blocked by CMOS switches 11S1 and 11S3 which are off, and inverted output QB will be unchanged as a high level.

[Data Latch Circuit 11—Status S118—Single Event]

Here, the possibility of the occurrence of single event on data latch circuit 11 in status S118 will be examined. Similar to the case of status S113, since the data latch circuit 11 is in the retention mode, the single event phenomenon at the flip-flop is prevented. However, data latch circuit 11 is subject to the occurrence of single event phenomenon at the input step of the input data signal.

[Data Latch Circuits According to Other Embodiments]

Data latch circuit 8 has a characteristic configuration that the input data signal input step in the prior art data latch circuit 7 is replaced by a transistor having a dual structure. Data latch circuit 9 has a characteristic configuration that the inverter in the flip-flop element of the prior art data latch circuit 7 is replaced by inverter 3 having a dual structure. Data latch circuit 11 has a characteristic configuration that two prior art data latch circuits has been modified by making their input data signal input steps in common, and the outputs from two inverters each comprised in the flip-flops are connected to the gate of the transistor constituting the other inverter in the same data latch circuit and to the gate of the transistor constituting the inverter corresponding to that other inverter in the other data latch circuit. Data latch circuits having structure obtained by combining at least one of the above-described three characteristic configurations are also available. Each of these data latch circuits has a duration to the single event which corresponds to its characteristic configuration.

[Layout Configuration of Arrangement of Elements]

Next, the configurations of SRAMs 4 and 5 and Data latch circuits 7 and 8 will be illustrated regarding the layout of the arrangement of the elements in cell unit. FIGS. 12 to 15 are layout diagrams showing the arrangement of the elements on the substrate in each of the circuits. In these figures, the portion which performs as a gate electrode is contained in the pattern having diagonal up, and the portion of diffusion layer which perform as a source or drain is contained in the pattern having diagonal down. The pattern with no diagonal contains such as metals and polysilicon, which perform as ordinary conductors. The square pattern filled with dots represents a contact electrically connecting the upper and lower layers. The square pattern painted out black represents a contact having other wirings thereon. The square filled with a group of "J" represents a contact electrically connecting the wirings in the top portion and the layers underneath. In the portion in which the gate electrode is placed on the upper part of the diffusion layer, the domain where the diffusion layer and the gate electrode overlap and the gate domain having different conductivity type from the diffusion layer are formed, and thus transistors are formed. In the figures, the domain which performs as a transistor is surrounded by a dashed line, and a symbol is attached thereto. For the ease of visibility, for the portion where the patterns of the layers overlap, an upper layer was illustrated so that it does not veil a lower layer according to the necessity.

[Layout Configuration of Arrangement of Elements in SRAMs 4 and 5]

Figure 12:
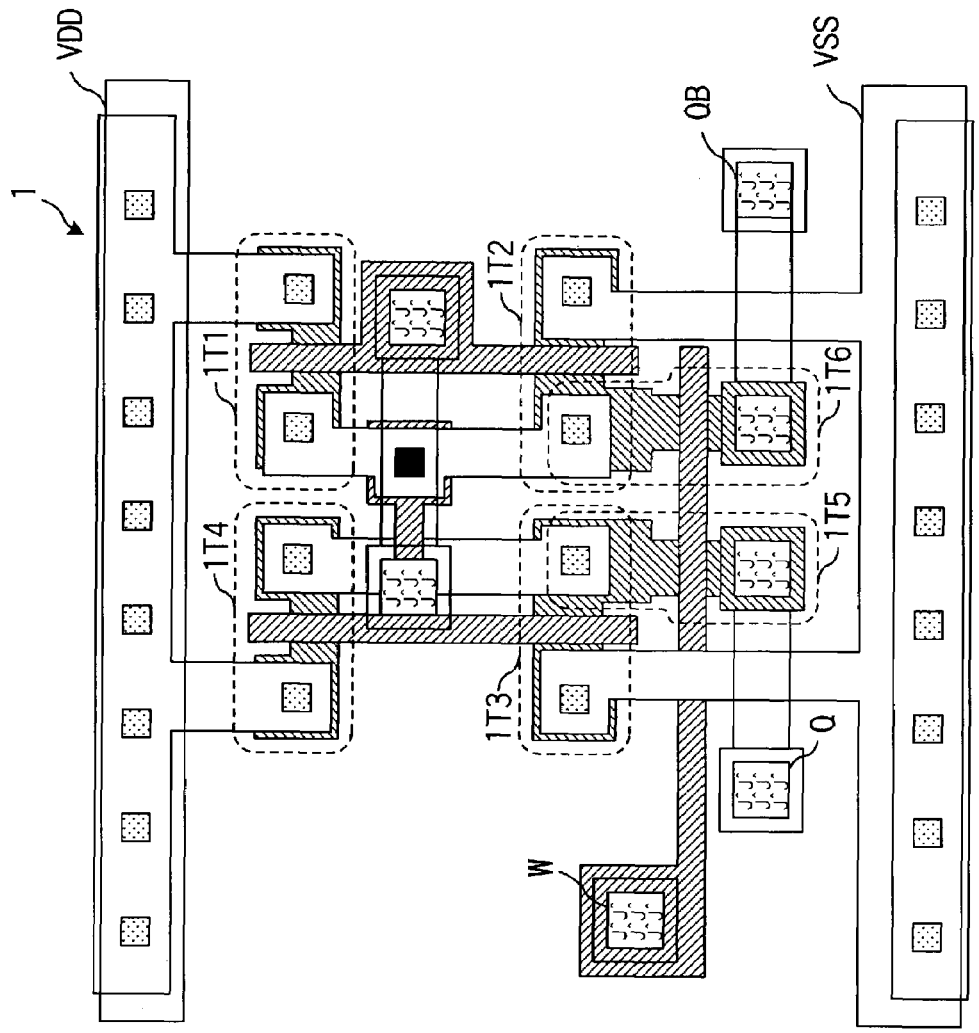
FIG. 12 is a layout diagram showing an example for arrangement on a substrate of the elements of prior art SRAM 4 having complete CMOS-type cell structure.
Figure 13:
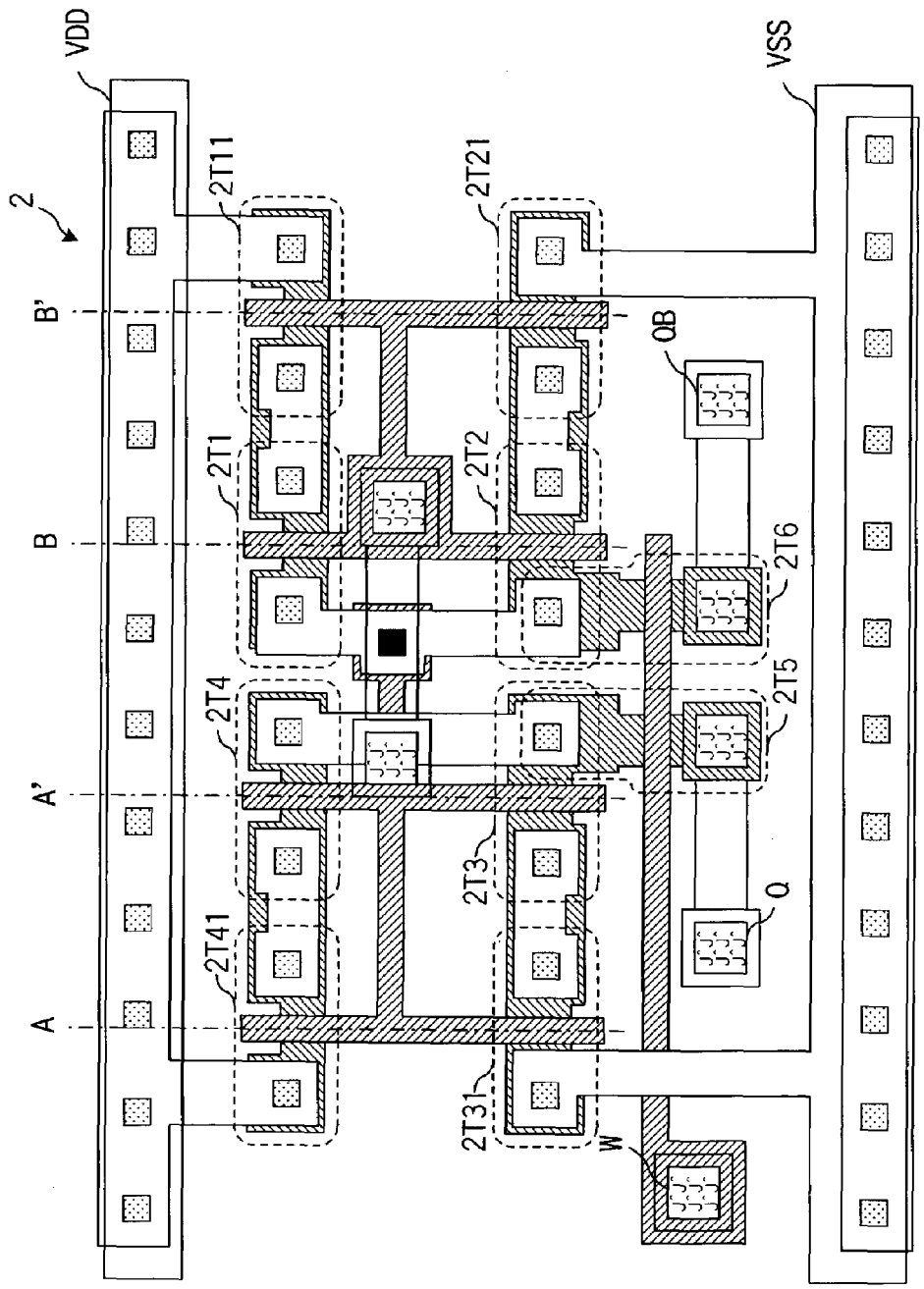
FIG. 13 is a layout diagram showing the arrangement on a substrate of the elements of SRAM 5 having complete CMOS-type cell structure and comprising a transistor having a dual structure according to an embodiment of the present invention.

FIG. 12 is a layout diagram showing an example for arrangement on a substrate of the elements of prior art SRAM 4 having complete CMOS-type cell structure. FIG. 13 is a layout diagram showing the arrangement on a substrate of the elements of SRAM 5 having complete CMOS-type cell structure and comprising a transistor having a dual structure according to an embodiment of the present invention. The codes and symbols used in FIGS. 12 and 13 correspond to those used in FIGS. 4 and 5. With referring to these figures, the difference in the layouts between SRAM 4 and SRAM 5 will be illustrated in detail.

In SRAM 5, transistors 5T1, 5T2, 5T3, and 5T4 in SRAM 5, which correspond to transistors 4T1, 4T2, 4T3, and 4T4 in SRAM 4, are connected with transistors 5T11, 5T21, 5T31, and 5T41 having a channel of the same conductivity type in series with respect to the line of a source or drain, and their gates are connected to each other. Because these transistors connected to form the dual structure have channel of the same conductivity type as the original transistors, it is possible to make the transistors such that the source or drain domain of one transistor shares its stretch of the diffusion layer with the source or drain domain of the other transistor. In this regard, it is preferred that the transistors having a dual structure are arranged so that the domains of diffusion layer constituting a source or drain are positioned along a single line. With this arrangement, it becomes possible in the case where the wiring distance between these transistors is maintained constant to maximize the distance between the transistors (typically the distance between the gates which is the shortest distance between the centers of the gates, that is, the distance between A-A' and B-B' in FIG. 13). When the distance between the transistors is large, it will reduce the possibility that both of the transistors malfunction at the same time caused by the effect on both of the transistors from the charge generated by a high energy particle irradiating to the element, and will reduce the probability of the occurrence of the single event. Although the larger the distance between the transistors is, the less the single event occurs, that larger distance is adverse to the general requirements for downsizing of the elements. Therefore, it is important to decide the distance between the transistors properly by taking both of the requirements for performance of preventing the single event and for the size of the element into consideration. In order to prevent the occurrence of the single event effectively, the distance between the transistors may be at least about 2 µm. This number is decided by considering the range of the average high energy particle in an element. The distance may be as large as an arbitral size within the range of about 2 μm to 5 μm, even when there is a requirement for downsizing the element. If there is no priority for the downsizing of the element, the distance may be as large as about 8 μm so that the endurance to the single event becomes extremely large.

[Layout Configuration of Arrangement of Elements in Data Latch Circuits 7 and 8]

Figure 14:
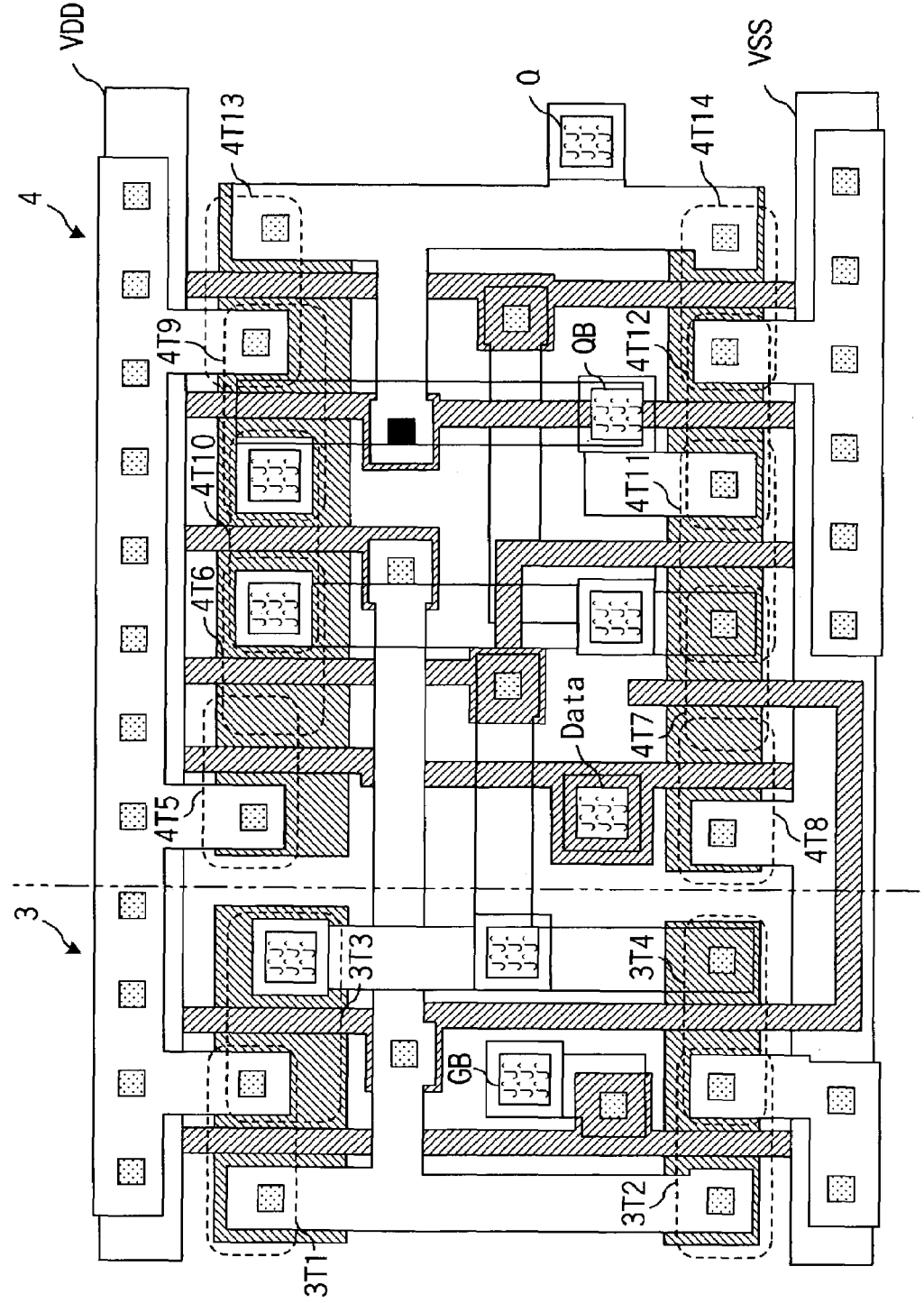
FIG. 14 is a layout diagram showing an example for the arrangement on a substrate of the elements of prior art data latch circuit 7.
Figure 15:
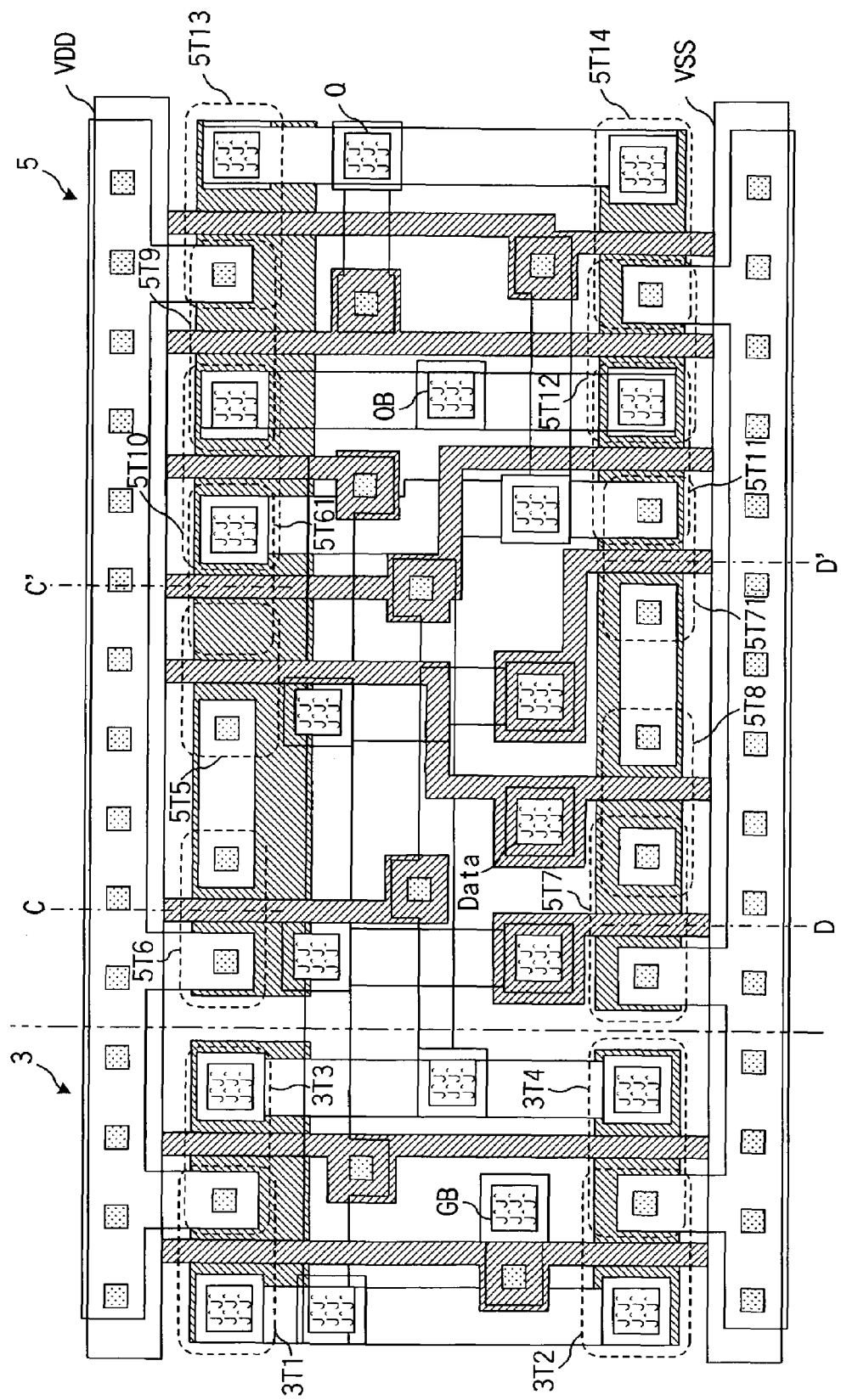
FIG. 15 is a layout diagram showing the arrangement on a substrate of the elements of data latch circuit 8 comprising a transistor having a dual structure according to an embodiment of the present invention.

FIG. 14 is a layout diagram showing an example for the arrangement on a substrate of the elements of prior art data latch circuit 7. FIG. 15 is a layout diagram showing the arrangement on a substrate of the elements of data latch circuit 8 comprising a transistor having a dual structure according to an embodiment of the present invention. The codes and symbols used in FIGS. 14 and 15 correspond to those used in FIGS. 6, 7 and 8. With referring to these figures, the difference in the layouts between data latch circuit 7 and data latch circuit 8 will be illustrated in detail. In data latch circuit 8, transistors 8T6 and 8T7 in data latch circuit 8, which correspond to transistors 7T6 and 7T7 in data latch circuit 7, are connected with transistors 8T61 and 8T71 having a channel of the same conductivity type in series with respect to the line of a source or drain via the line of a source or drain of transistors 8T5 and 8T8, whose gates are connected with input data signal Data, and their gates are connected to each other. These transistors connected to form the dual structure have channel of the same conductivity type as the transistors between these transistors and the original transistors to whose gates input data signal Data is input (and also as the original transistors). Therefore, it is possible to make the transistors such that the source or drain domain of the transistors connected to form the dual structure shares its stretch of the diffusion layer with the source or drain domain of the transistors to whose gates input data signal Data is input. In this connection, although it is possible to position the transistors connected to form the dual structure (8T61 or 8T71) adjoining to the original transistors (8T6 or 8T7), the distance between the transistors becomes larger when the transistors to whose gates input data signal Data is input (8T5 and 8T8) are inserted between them, as shown in this embodiment. In this regard, it is preferred that the transistors having a dual structure are arranged so that the domains of diffusion layer constituting a source or drain are positioned along a single line. With this arrangement, it becomes possible in the case where the wiring distance between these transistors is maintained constant to maximize the distance between the transistors (typically the distance between the gates which is the shortest distance between the centers of the gates, that is, the distance between C-C' and D-D' in FIG. 15). When the distance between the transistors is large, as described in relation to SRAM, it will the probability of the occurrence of the single event. Although the larger the distance between the transistors is, the less the single event occurs, that larger distance is adverse to the general requirements for downsizing of the elements. Therefore, it is important to decide the distance between the transistors properly by taking both of the requirements for performance of preventing the single event and for the size of the element into consideration. In order to prevent the occurrence of the single event effectively, taking both of the requirements for performance of preventing the single event and for the size of the element into consideration, the distance between the transistors may be within the range of about 2 μm to 5 μm, and may be up to as large as about 8 μm.

In the above-described illustration, the present invention has been explained in detail by using inverters, SRAMs and data latch circuits as embodiments for the dual structure of the transistors, using data latch circuits as embodiments for the dual structure of the flip-flops, and using data latch circuits as embodiments for the dual structure of the transistors contained in the data input elements controlled by the clock signal (such as COMS switches and clocked inverters). However, the technical idea of the present invention that the elements playing important roles in the circuit such as transistors are modified so that they have dual structures can be applied any types of semiconductor logic circuits containing inverters, flip-flop elements, elements having data input element which is controlled by the clock signal. For the above-described embodiments of SRAM, illustration has been given by using a simple flip-flop in which the outputs and the inputs are cross-connected as basic configuration. However, other logic circuits comprising inverter elements, such as a flip-flop having a structure in which the input(s) and the output in NOR gate are cross-connected, also includes such basic configuration. Thus, a semiconductor logic circuit comprising a transistor having a dual structure in its flip-flop element or an element controlled by clock signal, and a device such as a processor or a circuit board comprising the same are all within the scope of the claimed present invention.

According to the present invention, a malfunction due to single event can be prevented by introducing a dual structure to the transistor in a flip-flop or a data input step controlled by a clock of a semiconductor logic circuit such as inverter, SRAM or data latch circuit. The dual structure can be formed by connecting a transistor with a MOS transistor having a channel of the same conductivity type in series with respect to the line of a source or drain and connecting their gates to each other, by connecting an inverter with p-MOS transistors, one for VDD side and one for VSS side of the output step, or, as for flip-flop, by connecting the output from the inverter constituting one flip-flop to the gate of the transistor constituting the other inverter in the same flip-flop, and to the gate of the transistor having the same conductivity type and constituting the inverter corresponding to said other inverter in the other flip-flop, and each of these structures properly prevents single event. Regarding the dual structure for flip-flop, in order to prevent single event more effectively, it is preferred that p-channel transistor and n-channel transistor constituting single inverter have different drive performances so that the downstream of the inverter will not be affected by the single event. In order to reduce the possibility of occurrence of single event throughout the area of several elements, it is preferred to position the domain of the source and drain of two MOS transistors contained in the MOS transistor having the dual structure along a single line, and more preferably, by spacing a predetermined space between the gates of each other.

What is claimed is:

1. An inverter having a structure that a first p-channel MOS transistor and a first n-channel MOS transistor are connected in this order in series with respect to the line of a source or drain and from the node connected on the side of the first power supply to the node connected on the side of the second power supply, wherein:

said first p-channel MOS transistor constitutes a dual structure by being connected with a second p-channel MOS transistor in series with respect to the line of a source or drain at the node on the side of the second power supply, and their gates being connected to each other, and said first n-channel MOS transistor constitutes a dual structure by being connected with a third p-channel MOS transistor in series with respect to the line of a source or drain at the node on the side of the first power supply, and the gate of the third p-channel MOS transistor being connected in common to the node of said n-channel MOS transistor on the side of the first power supply and the node of said first p-channel MOS transistor on the side of the second power supply, wherein the connection of the gates defines an input.

2. An inverter in which a first p-channel MOS transistor, a second p-channel MOS transistor, a third p-channel MOS transistor and an n-channel MOS transistor, each of which constitutes an inverter, are connected in this order in series with respect to the line of a source or drain and from the node connected on the side of a first power supply to the node connected on the side of a second power supply, wherein:

the gates of said first p-channel MOS transistor, said second p-channel MOS transistor and said n-channel MOS transistor are connected in common and are connected to the input of said inverter, the gate of said third p-channel MOS transistor is connected to the node between said third p-channel MOS transistor and said n-channel MOS transistor with respect to the line of a source or drain, and in common to the node between said first p-channel MOS transistor and said second p-channel transistor with respect to the line of a source or drain, the node between said second p-channel MOS transistor and said third p-channel MOS transistor on the line of a source or drain is connected to the output of said inverter, said first p-channel MOS transistor and said second p-channel MOS transistor form a p-channel MOS transistor having a dual structure, and said third p-channel MOS transistor and said n-channel MOS transistor form an n-channel MOS transistor having a dual structure.

3. An inverter having a structure that a first p-channel MOS transistor and a first n-channel MOS transistor are connected in this order in series with respect to the line of a source or drain and from the node connected to the side of the first power supply to the node connected to the side of the second power supply, wherein:

at least one of said first p-channel MOS transistor and said first n-channel MOS transistor constitutes a dual structure by being connected with a second MOS transistor having a channel of the same conductivity type in series with respect to the line of a source or drain, and their gates being connected to each other, and the domain of the source and drain of two MOS transistors contained in the MOS transistor having said dual structure are positioned along a single line.

4. An inverter having a structure that a first p-channel MOS transistor and a first n-channel MOS transistor are connected in this order in series with respect to the line of a source or drain and from the node connected to the side of the first power supply to the node connected to the side of the second power supply, wherein:

at least one of said first p-channel MOS transistor and said first n-channel MOS transistor constitutes a dual structure by being connected with a second MOS transistor having a channel of the same conductivity type in series with respect to the line of a source or drain, and their gates being connected to each other, and two MOS transistors contained in the MOS transistor having said dual structure are positioned by spacing a predetermined space between the gates of each other.

5. The inverter of claim 3, wherein said predetermined space between the gates is between 2 µm and 8 µm.

6. The inverter of claim 3, wherein said predetermined space between the gates is between 2 µm and 5 µm.

7. A semiconductor logic circuit comprising two inverters cross-connected to each other by connecting the output of one to the input of the other, wherein:

at least one inverter of said inverters is an inverter having a structure that a first p-channel MOS transistor and a first n-channel MOS transistor are connected in this order in series with respect to the line of a source or drain and from the node connected to the side of the first power supply to the node connected to the side of the second power supply, wherein:

at least one of said first p-channel MOS transistor and said first n-channel MOS transistor constitutes a dual structure by being connected with a second MOS transistor having a channel of the same conductivity type in series with respect to the line of a source or drain, and their gates being connected to each other; and two MOS transistors contained in the MOS transistor having said dual structure are positioned by spacing a predetermined space between each other's gates.

8. A static random access memory comprising two inverters cross-connected to each other by connecting the output of one to the input of the other, wherein:

at least one inverter of said inverters is an inverter having a structure that a first p-channel MOS transistor and a first n-channel MOS transistor are connected in this order in series with respect to the line of a source or drain and from the node connected to the side of the first power supply to the node connected to the side of the second power supply, wherein:

at least one of said first p-channel MOS transistor and said first n-channel MOS transistor constitutes a dual structure by being connected with a second MOS transistor having a channel of the same conductivity type in series with respect to the line of a source or drain, and their gates being connected to each other; and two MOS transistors contained in the MOS transistor having said dual structure are positioned by spacing a predetermined space between each other's gates.

9. A data latch circuit comprising two inverters cross-connected to each other by connecting the output of one to the input of the other where the output of one of said inverters is connected to the input of the other of said inverters under the control of the inverted logic signal of the clock signal for control, wherein:

at least one inverter of said inverters is an inverter having a structure that a first p-channel MOS transistor and a first n-channel MOS transistor are connected in this order in series with respect to the line of a source or drain and from the node connected to the side of the first power supply to the node connected to the side of the second power supply, wherein:

at least one of said first p-channel MOS transistor and said first n-channel MOS transistor constitutes a dual structure by being connected with a second MOS transistor having a channel of the same conductivity type in series with respect to the line of a source or drain, and their gates being connected to each other; and two MOS transistors contained in the MOS transistor having said dual structure are positioned by spacing a predetermined space between each other's gates.

10. A semiconductor logic circuit comprising a CMOS switch in which a data signal is connected to one terminal and said data signal is output from the other terminal to a downstream under the control of the clock signal for control, wherein:

at least one MOS transistor of the p-channel MOS transistor and the n-channel MOS transistor contained in said CMOS switch whose gate is connected to said clock signal for control constitutes a dual structure by being connected with a MOS transistor having a channel of the same conductivity type in series with respect to the line of a source or drain, and their gates being connected to each other, and two MOS transistors contained in the MOS transistor having said dual structure are connected, via the line of a source or drain of MOS transistor whose gate is connected to said data signal, in series with respect to the line of a source or drain.

11. A semiconductor logic circuit comprising a CMOS switch in which a data signal is connected to one terminal and said data signal is output from the other terminal to a downstream under the control of the clock signal for control, wherein:

at least one MOS transistor of the p-channel MOS transistor and the n-channel MOS transistor contained in said CMOS switch whose gate is connected to said clock signal for control constitutes a dual structure by being connected with a MOS transistor having a channel of the same conductivity type in series with respect to the line of a source or drain, and their gates being connected to each other, and said semiconductor logic circuit is a data latch circuit which further comprises:

the second inverter whose input is connected to said signal output to a downstream, and the third inverter, which is controlled by complementary clock signals of logic functionally contrary to said clock signal for control, whose input is connected to the output of said second inverter, and whose output is connected to the input of said second inverter.

12. A semiconductor logic circuit comprising a CMOS switch in which a data signal is connected to one terminal and said data signal is output from the other terminal to a downstream under the control of the clock signal for control, wherein:

at least one MOS transistor of the p-channel MOS transistor and the n-channel MOS transistor contained in said CMOS switch whose gate is connected to said clock signal for control constitutes a dual structure by being connected with a MOS transistor having a channel of the same conductivity type in series with respect to the line of a source or drain, and their gates being connected to each other, and the domain of the source and drain of two MOS transistors contained in the MOS transistor having said dual structure are positioned along a single line.

13. A semiconductor logic circuit comprising a CMOS switch in which a data signal is connected to one terminal and said data signal is output from the other terminal to a downstream under the control of the clock signal for control, wherein:

at least one MOS transistor of the p-channel MOS transistor and the n-channel MOS transistor contained in said CMOS switch whose gate is connected to said clock signal for control constitutes a dual structure by being connected with a MOS transistor having a channel of the same conductivity type in series with respect to the line of a source or drain, and their gates being connected to each other, and two MOS transistors contained in the MOS transistor having said dual structure are positioned by spacing a predetermined space between the gates of each other.

14. The semiconductor logic circuit of claim 13, wherein said predetermined space between the gates is between 2 μm and 8 μm.

15. The semiconductor logic circuit of claim 13, wherein said predetermined space between the gates is between 2 μm and 5 μm.

16. A semiconductor logic circuit comprising a first inverter in which a data signal is connected to the input and an inverted logic signal of said data signal is output to a downstream under the control of the complementary clock signals for control, wherein:

at least one MOS transistor of the p-channel MOS transistor and the n-channel MOS transistor contained in said first inverter whose gate is connected to said complementary clock signal for control constitutes a dual structure by being connected with a MOS transistor having a channel of the same conductivity type in series with respect to the line of a source or drain, and their gates being connected to each other, and two MOS transistors contained in the MOS transistor having said dual structure are connected, via the line of a source or drain of MOS transistor whose gate is connected to said data signal, in series with respect to the line of a source or drain.

17. A semiconductor logic circuit comprising a first inverter in which a data signal is connected to the input and an inverted logic signal of said data signal is output to a downstream under the control of the complementary clock signals for control, wherein:

at least one MOS transistor of the p-channel MOS transistor and the n-channel MOS transistor contained in said first inverter whose gate is connected to said complementary clock signal for control constitutes a dual structure by being connected with a MOS transistor having a channel of the same conductivity type in series with respect to the line of a source or drain, and their gates being connected to each other, and said semiconductor logic circuit is a data latch circuit which further comprises:

the second inverter whose input is connected to said signal output to a downstream, and the third inverter, which is controlled by a complementary clock signal of logic contrary to said complementary clock signal for control, whose input is connected to the output of said second inverter, and whose output is connected to the input of said second inverter.

18. A semiconductor logic circuit comprising a first inverter in which a data signal is connected to the input and an inverted logic signal of said data signal is output to a downstream under the control of the complementary clock signals for control, wherein:

at least one MOS transistor of the p-channel MOS transistor and the n-channel MOS transistor contained in said first inverter whose gate is connected to said complementary clock signal for control constitutes a dual structure by being connected with a MOS transistor having a channel of the same conductivity type in series with respect to the line of a source or drain, and their gates being connected to each other, and the domain of the source and drain of two MOS transistors contained in the MOS transistor having said dual structure are positioned along a single line.

19. A semiconductor logic circuit comprising a first inverter in which a data signal is connected to the input and an inverted logic signal of said data signal is output to a downstream under the control of the complementary clock signals for control, wherein:

at least one MOS transistor of the p-channel MOS transistor and the n-channel MOS transistor contained in said first inverter whose gate is connected to said complementary clock signal for control constitutes a dual structure by being connected with a MOS transistor having a channel of the same conductivity type in series with respect to the line of a source or drain, and their gates being connected to each other, and two MOS transistors contained in the MOS transistor having said dual structure are positioned by spacing a predetermined space between the gate of each other.

20. The semiconductor logic circuit of claim 19, wherein said predetermined space between the gates is between 2 μm and 8 μm.

21. The semiconductor logic circuit of claim 19, wherein said predetermined space between the gates is between 2 μm and 5 μm.

22. A data latch circuit comprising:

a first data latch circuit which comprises a first inverter (11I1), a second inverter (11I2), a first CMOS switch (11S1) in which a data signal is connected to one terminal and said data signal is output from the other terminal to a downstream under the control of the clock signal for control, and a second CMOS switch (11S2) in which the output of said second inverter is connected to one terminal and the data signal input from said one terminal is output from the other terminal to a downstream under the control of the inverted logic signal of said clock signal; and a second data latch circuit which comprises a third inverter (11I3), a fourth inverter (11I4), a third CMOS switch (11S3) in which said data signal is connected to one terminal and said data signal is output from the other terminal to a downstream under the control of said clock signal for control, and a fourth CMOS switch (11S4) in which the output of said fourth inverter is connected to one terminal and the data signal input from said one terminal is output from the other terminal to a downstream under the control of the inverted logic signal of said clock signal, wherein:

each of said first, second, third and fourth inverters comprises a p-channel MOS transistor and an n-channel MOS transistor connected in series with respect to the line of a source or drain;

the output of said first inverter is connected to the gate of the transistor having one conductivity type of said second inverter and to the gate of the transistor having said one conductivity type of said fourth inverter;

the output of said third inverter is connected to the gate of the transistor having the other conductivity type of said second inverter and to the gate of the transistor having said other conductivity type of said fourth inverter;

the output of said second inverter is connected, via said second CMOS switch, to the gate of the transistor having one conductivity type of said first inverter and to the gate of the transistor having said one conductivity type of said third inverter;

the output of said fourth inverter is connected, via said fourth CMOS switch, to the gate of the transistor having the other conductivity type of said first inverter and to the gate of the transistor having said other conductivity type of said third inverter;

the output from said other terminal of said first CMOS switch is connected to the output from said other terminal of said second CMOS switch, to the gate of the transistor having said one conductivity type of said first inverter and to the gate of the transistor having said one conductivity type of said third inverter; and the output from said other terminal of said third CMOS switch is connected to the output from said other terminal of said fourth CMOS switch, to the gate of the transistor having said other conductivity type of said first inverter and to the gate of the transistor having said other conductivity type of said third inverter.

23. The data latch circuit of claim 22, wherein:

the inverter of said first to fourth inverters comprises a p-channel MOS transistor and an n-channel MOS transistor, in which the drive performance of one MOS transistor is larger than the drive performance of the other MOS transistor;

when the drive performance of said p-channel MOS transistor is larger than the drive performance of said n-channel transistor, the output of said inverter is connected, either directly or via a CMOS switch, to the gates of p-channel MOS transistors included in each of the inverters contained, between the combination of the first and the third inverters and the combination of the second and the fourth inverters, in the combination of the inverters which does not include said inverter; and when the drive performance of said n-channel MOS transistor is larger than the drive performance of said p-channel transistor, the output of said inverter is connected, either directly or via a CMOS switch, to the gates of n-channel MOS transistors included in each of the inverters contained, between the combination of the first and the third inverters and the combination of the second and the fourth inverters, in the combination of the inverters which does not include said inverter.

* * * * *